United States Patent
Yu et al.

(10) Patent No.: US 11,387,191 B2
(45) Date of Patent: Jul. 12, 2022

(54) INTEGRATED CIRCUIT PACKAGE AND METHOD

(71) Applicant: Taiwan Semiconductor Manufacturing Company, Ltd., Hsinchu (TW)

(72) Inventors: Chen-Hua Yu, Hsinchu (TW); Tzu Yun Huang, Taipei (TW); Ming-Che Ho, Tainan (TW); Hung-Jui Kuo, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/515,251

(22) Filed: Jul. 18, 2019

(65) Prior Publication Data
US 2021/0020584 A1     Jan. 21, 2021

(51) Int. Cl.
*H01L 23/00*     (2006.01)
*H01L 21/48*     (2006.01)
(Continued)

(52) U.S. Cl.
CPC ........ *H01L 23/562* (2013.01); *H01L 21/4857* (2013.01); *H01L 21/561* (2013.01);
(Continued)

(58) Field of Classification Search
CPC . H01L 23/562; H01L 23/49822; H01L 23/16; H01L 21/4857; H01L 21/568; H01L 21/561; H01L 23/5383; H01L 23/3128; H01L 25/50; H01L 25/105; H01L 21/78; H01L 23/3121; H01L 2225/1058; H01L 2224/48227; H01L 24/48; H01L 23/49816;
(Continued)

(56) References Cited

U.S. PATENT DOCUMENTS 8,361,842 B2    1/2013    Yu et al.
8,680,647 B2    3/2014    Yu et al.
(Continued)

FOREIGN PATENT DOCUMENTS

JP     2011018906 A    1/2011
KR    20170015052 A    2/2017
(Continued)

*Primary Examiner* — Benjamin Tzu-Hung Liu
(74) *Attorney, Agent, or Firm* — Slater Matsil, LLP

(57) ABSTRACT

In an embodiment, a device includes: an integrated circuit die; an encapsulant at least partially surrounding the integrated circuit die; and a redistribution structure including: a plurality of dielectric layers over the encapsulant and the integrated circuit die; a plurality of metallization patterns in the dielectric layers, the metallization patterns being electrically coupled to the integrated circuit die; and a sealing ring in the dielectric layers, the sealing ring extending around the metallization patterns, the sealing ring being electrically isolated from the metallization patterns and the integrated circuit die, the sealing ring including a plurality of sealing ring layers, each of the sealing ring layers including a via portion extending through a respective one of the dielectric layers, the via portion of each of the sealing ring layers being aligned along a same common axis.

20 Claims, 27 Drawing Sheets

(51) Int. Cl.
    *H01L 21/56*     (2006.01)
    *H01L 21/78*     (2006.01)
    *H01L 23/16*     (2006.01)
    *H01L 23/31*     (2006.01)
    *H01L 23/498*     (2006.01)
    *H01L 23/538*     (2006.01)
    *H01L 25/00*     (2006.01)
    *H01L 25/10*     (2006.01)

(52) U.S. Cl.
    CPC ............ *H01L 21/568* (2013.01); *H01L 21/78* (2013.01); *H01L 23/16* (2013.01); *H01L 23/3121* (2013.01); *H01L 23/3128* (2013.01); *H01L 23/49822* (2013.01); *H01L 23/5383* (2013.01); *H01L 25/105* (2013.01); *H01L 25/50* (2013.01); *H01L 24/48* (2013.01); *H01L 2224/48227* (2013.01); *H01L 2225/1058* (2013.01)

(58) Field of Classification Search
    CPC ............... H01L 21/486; H01L 23/5389; H01L 2221/68381; H01L 21/6835; H01L 2221/68327; H01L 2221/68359; H01L 2221/68345; H01L 23/52; H01L 2924/35121; H01L 23/585; H01L 2224/97; H01L 2225/0651; H01L 2225/06568; H01L 2225/1035; H01L 2224/92244; H01L 2224/04105; H01L 2224/12105; H01L 2924/15311; H01L 2224/48091; H01L 2224/73265; H01L 2224/73267; H01L 2224/32145; H01L 2224/32225; H01L 2224/24137; H01L 23/3114; H01L 23/5384; H01L 23/5386; H01L 21/56; H01L 21/76897; H01L 21/76835; H01L 21/76816

See application file for complete search history.

(56) References Cited

U.S. PATENT DOCUMENTS

| | | | |
|---|---|---|---|
| 8,703,542 | B2 | 4/2014 | Lin et al. |
| 8,759,964 | B2 | 6/2014 | Pu et al. |
| 8,778,738 | B1 | 7/2014 | Lin et al. |
| 8,785,299 | B2 | 7/2014 | Mao et al. |
| 8,803,306 | B1 | 8/2014 | Yu et al. |
| 8,809,996 | B2 | 8/2014 | Chen et al. |
| 8,829,676 | B2 | 9/2014 | Yu et al. |
| 8,877,554 | B2 | 11/2014 | Tsai et al. |
| 2005/0098893 | A1* | 5/2005 | Tsutsue ............... H01L 23/5226 257/758 |
| 2009/0035940 | A1* | 2/2009 | Richardson ............ C25D 7/123 438/674 |
| 2011/0006389 | A1 | 1/2011 | Bachman et al. |
| 2011/0291288 | A1 | 12/2011 | Wu et al. |
| 2013/0026468 | A1 | 1/2013 | Yoshimuta et al. |
| 2013/0062760 | A1 | 3/2013 | Hung et al. |
| 2013/0062761 | A1 | 3/2013 | Lin et al. |
| 2013/0087914 | A1* | 4/2013 | Yang ...................... H01L 24/19 257/773 |
| 2013/0168848 | A1 | 7/2013 | Lin et al. |
| 2013/0307140 | A1 | 11/2013 | Huang et al. |
| 2014/0203429 | A1 | 7/2014 | Yu et al. |
| 2014/0225222 | A1 | 8/2014 | Yu et al. |
| 2014/0252646 | A1 | 9/2014 | Hung et al. |
| 2014/0264930 | A1 | 9/2014 | Yu et al. |
| 2014/0343901 | A1* | 11/2014 | Sun ........................ G06F 30/394 703/2 |
| 2015/0294939 | A1* | 10/2015 | Yu ........................... H01L 24/19 257/529 |
| 2016/0013138 | A1 | 1/2016 | Chen et al. |
| 2016/0307862 | A1* | 10/2016 | Lin ........................ H01L 24/20 |
| 2017/0032977 | A1* | 2/2017 | Chen ..................... H01L 21/486 |
| 2017/0221819 | A1* | 8/2017 | Chu ........................ H01L 23/5223 |
| 2018/0012770 | A1* | 1/2018 | Macelwee ........... H01L 23/3185 |
| 2018/0033695 | A1* | 2/2018 | Chang .................... H01L 24/17 |
| 2018/0151540 | A1 | 5/2018 | Yu et al. |
| 2019/0051621 | A1 | 2/2019 | Liu et al. |
| 2019/0051622 | A1 | 2/2019 | Chen et al. |
| 2019/0164783 | A1 | 5/2019 | Huang et al. |
| 2019/0229028 | A1* | 7/2019 | Mohammed ........... H01L 24/05 |

FOREIGN PATENT DOCUMENTS

| | | |
|---|---|---|
| KR | 20190064387 A | 6/2019 |
| TW | 201727845 A | 8/2017 |
| TW | 201830649 A | 8/2018 |
| TW | 201911516 A | 3/2019 |

* cited by examiner

INTEGRATED CIRCUIT PACKAGE AND METHOD

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 15 through 20 illustrate formation and implementation of device stacks, in accordance with some embodiments.

DETAILED DESCRIPTION

Figure 1:
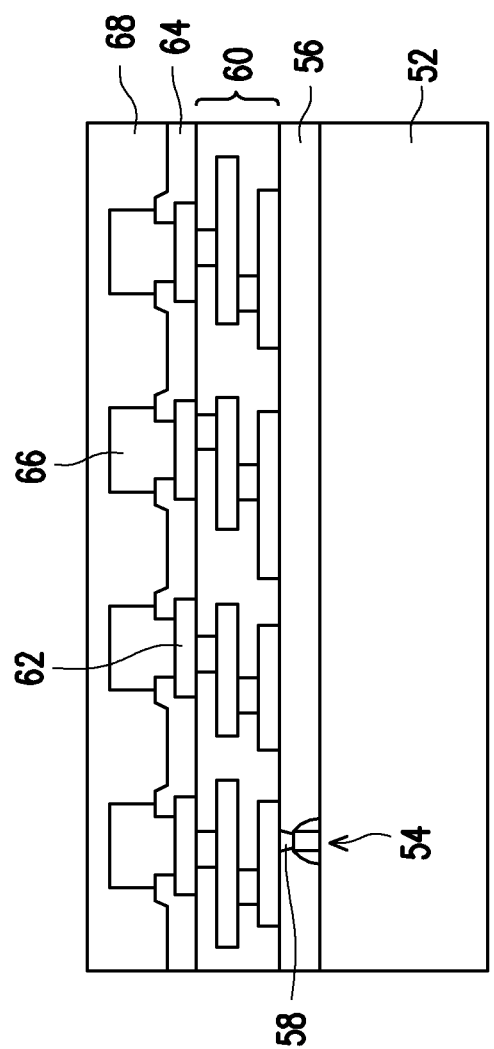
FIG. 1 illustrates a cross-sectional view of an integrated circuit die, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a sealing ring is formed in a redistribution structure. The sealing ring is electrically non-function, and is formed concurrently with electrically functional features of the redistribution structure. The sealing ring surrounds the electrically functional features of the redistribution structure. During singulation of the redistribution structure, the sealing ring stops the spreading of singulation-induced cracks. Delamination and peeling in the redistribution structure may thus be reduced or avoided.

FIG. 1 illustrates a cross-sectional view of an integrated circuit die 50, in accordance with some embodiments. The integrated circuit die 50 will be packaged in subsequent processing to form an integrated circuit package. The integrated circuit die 50 may be a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof.

The integrated circuit die 50 may be formed in a wafer, which may include different device regions that are singulated in subsequent steps to form a plurality of integrated circuit dies. The integrated circuit die 50 may be processed according to applicable manufacturing processes to form integrated circuits. For example, the integrated circuit die 50 includes a semiconductor substrate 52, such as silicon, doped or undoped, or an active layer of a semiconductor-on-insulator (SOI) substrate. The semiconductor substrate 52 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate 52 has an active surface (e.g., the surface facing upwards in FIG. 1), sometimes called a front side, and an inactive surface (e.g., the surface facing downwards in FIG. 1), sometimes called a back side.

Devices 54 may be formed at the front surface of the semiconductor substrate 52. The devices 54 may be active devices (e.g., transistors, diodes, etc.), capacitors, resistors, etc. An inter-layer dielectric (ILD) 56 is over the front surface of the semiconductor substrate 52. The ILD 56 surrounds and may cover the devices 54. The ILD 56 may include one or more dielectric layers formed of materials such as Phospho-Silicate Glass (PSG), Boro-Silicate Glass (BSG), Boron-Doped Phospho-Silicate Glass (BPSG), undoped Silicate Glass (USG), or the like.

Conductive plugs 58 extend through the ILD 56 to electrically and physically couple the devices 54. For example, when the devices 54 are transistors, the conductive plugs 58 may couple the gates and source/drain regions of the transistors. The conductive plugs 58 may be formed of tungsten, cobalt, nickel, copper, silver, gold, aluminum, the like, or combinations thereof. An interconnect structure 60 is over the ILD 56 and conductive plugs 58. The interconnect structure 60 interconnects the devices 54 to form an integrated circuit. The interconnect structure 60 may be formed by, for example, metallization patterns in dielectric layers on the ILD 56. The metallization patterns include metal lines and vias formed in one or more low-k dielectric layers. The metallization patterns of the interconnect structure 60 are electrically coupled to the devices 54 by the conductive plugs 58.

The integrated circuit die 50 further includes pads 62, such as aluminum pads, to which external connections are made. The pads 62 are on the active side of the integrated circuit die 50, such as in and/or on the interconnect structure 60. One or more passivation films 64 are on the integrated circuit die 50, such as on portions of the interconnect structure 60 and pads 62. Openings extend through the passivation films 64 to the pads 62. Die connectors 66, such as conductive pillars (for example, formed of a metal such as copper), extend through the openings in the passivation films 64 and are physically and electrically coupled to respective ones of the pads 62. The die connectors 66 may be formed by, for example, plating, or the like. The die connectors 66 electrically couple the respective integrated circuits of the integrated circuit die 50.

Optionally, solder regions (e.g., solder balls or solder bumps) may be disposed on the pads 62. The solder balls may be used to perform chip probe (CP) testing on the integrated circuit die 50. CP testing may be performed on the integrated circuit die 50 to ascertain whether the integrated circuit die 50 is a known good die (KGD). Thus, only integrated circuit dies 50, which are KGDs, undergo subsequent processing are packaged, and dies, which fail the CP testing, are not packaged. After testing, the solder regions may be removed in subsequent processing steps.

A dielectric layer 68 may (or may not) be on the active side of the integrated circuit die 50, such as on the passivation films 64 and the die connectors 66. The dielectric layer 68 laterally encapsulates the die connectors 66, and the dielectric layer 68 is laterally coterminous with the integrated circuit die 50. Initially, the dielectric layer 68 may bury the die connectors 66, such that the topmost surface of the dielectric layer 68 is above the topmost surfaces of the die connectors 66. In some embodiments where solder regions are disposed on the die connectors 66, the dielectric layer 68 may also bury the solder regions. Alternatively, the solder regions may be removed prior to forming the dielectric layer 68.

The dielectric layer 68 may be a polymer such as PBO, polyimide, BCB, or the like; a nitride such as silicon nitride or the like; an oxide such as silicon oxide, PSG, BSG, BPSG, or the like; the like, or a combination thereof. The dielectric layer 68 may be formed, for example, by spin coating, lamination, chemical vapor deposition (CVD), or the like. In some embodiments, the die connectors 66 are exposed through the dielectric layer 68 during formation of the integrated circuit die 50. In some embodiments, the die connectors 66 remain buried and are exposed during a subsequent process for packaging the integrated circuit die 50. Exposing the die connectors 66 may remove any solder regions that may be present on the die connectors 66.

In some embodiments, the integrated circuit die 50 is a stacked device that include multiple semiconductor substrates 52. For example, the integrated circuit die 50 may be a memory device such as a hybrid memory cube (HMC) module, a high bandwidth memory (HBM) module, or the like that includes multiple memory dies. In such embodiments, the integrated circuit die 50 includes multiple semiconductor substrates 52 interconnected by through-substrate vias (TSVs). Each of the semiconductor substrates 52 may (or may not) have an interconnect structure 60.

Figure 10:
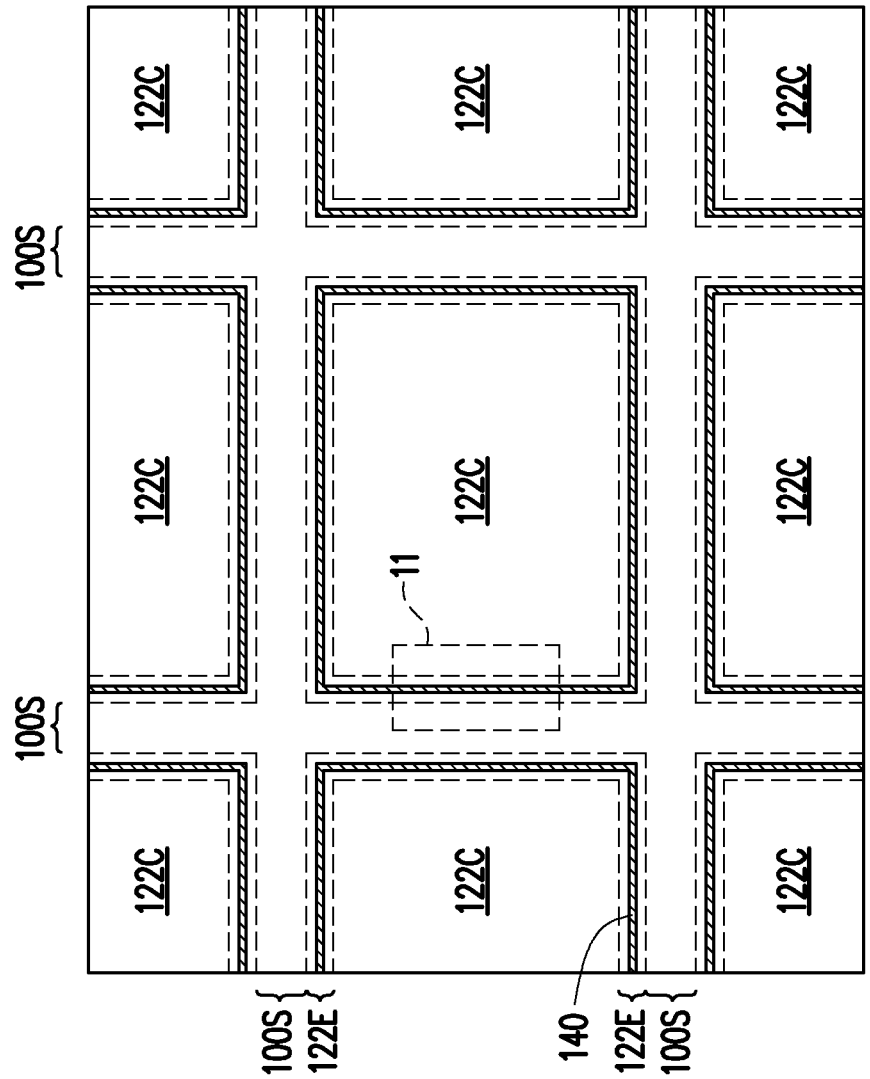
Figure 11:
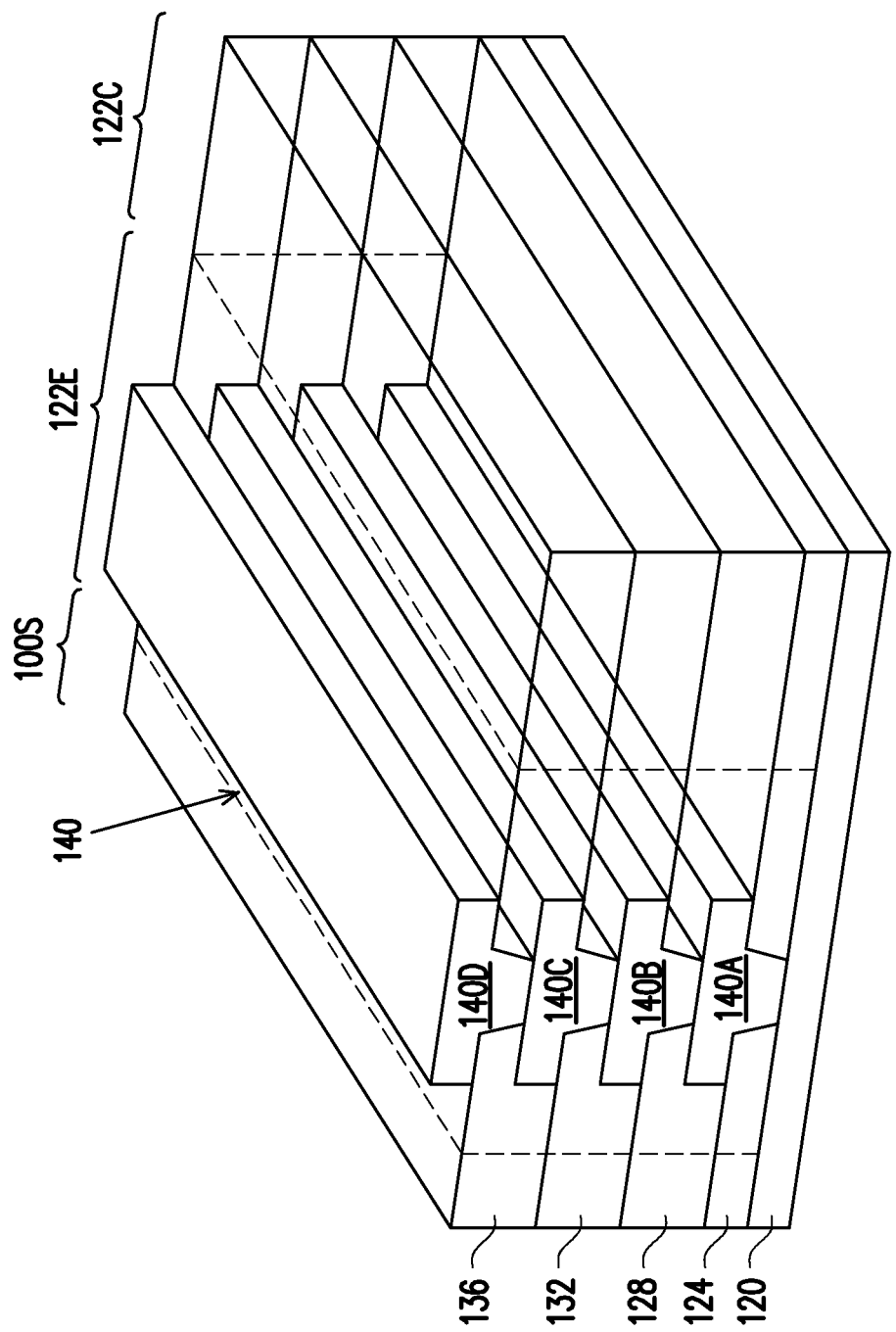
Figure 18:
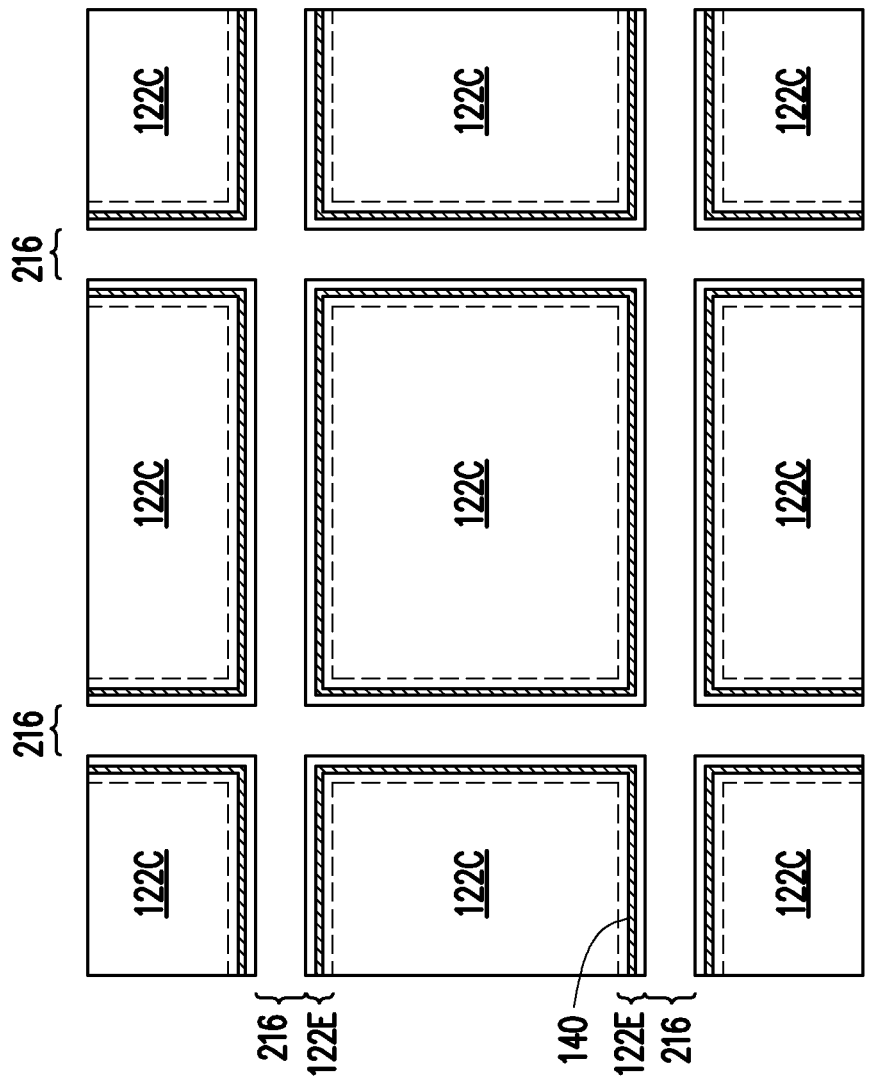

FIGS. 2 through 9E and 12 through 14 illustrate cross-sectional views of intermediate steps during a process for forming a first package component 100, in accordance with some embodiments. FIGS. 10 and 18 illustrate plan views of intermediate steps during the process for forming the first package component 100, in accordance with some embodiments. FIG. 11 illustrates a perspective view of an intermediate step during the process for forming the first package component 100, in accordance with some embodiments. A first package region 100A and a second package region 100B are illustrated, and one or more of the integrated circuit dies 50 are packaged to form an integrated circuit package in each of the package regions 100A and 100B. The integrated circuit packages may also be referred to as integrated fan-out (InFO) packages. Each of the package regions 100A and 100B are separated by a scribe line region 100S, which is discussed further below.

Figure 2:
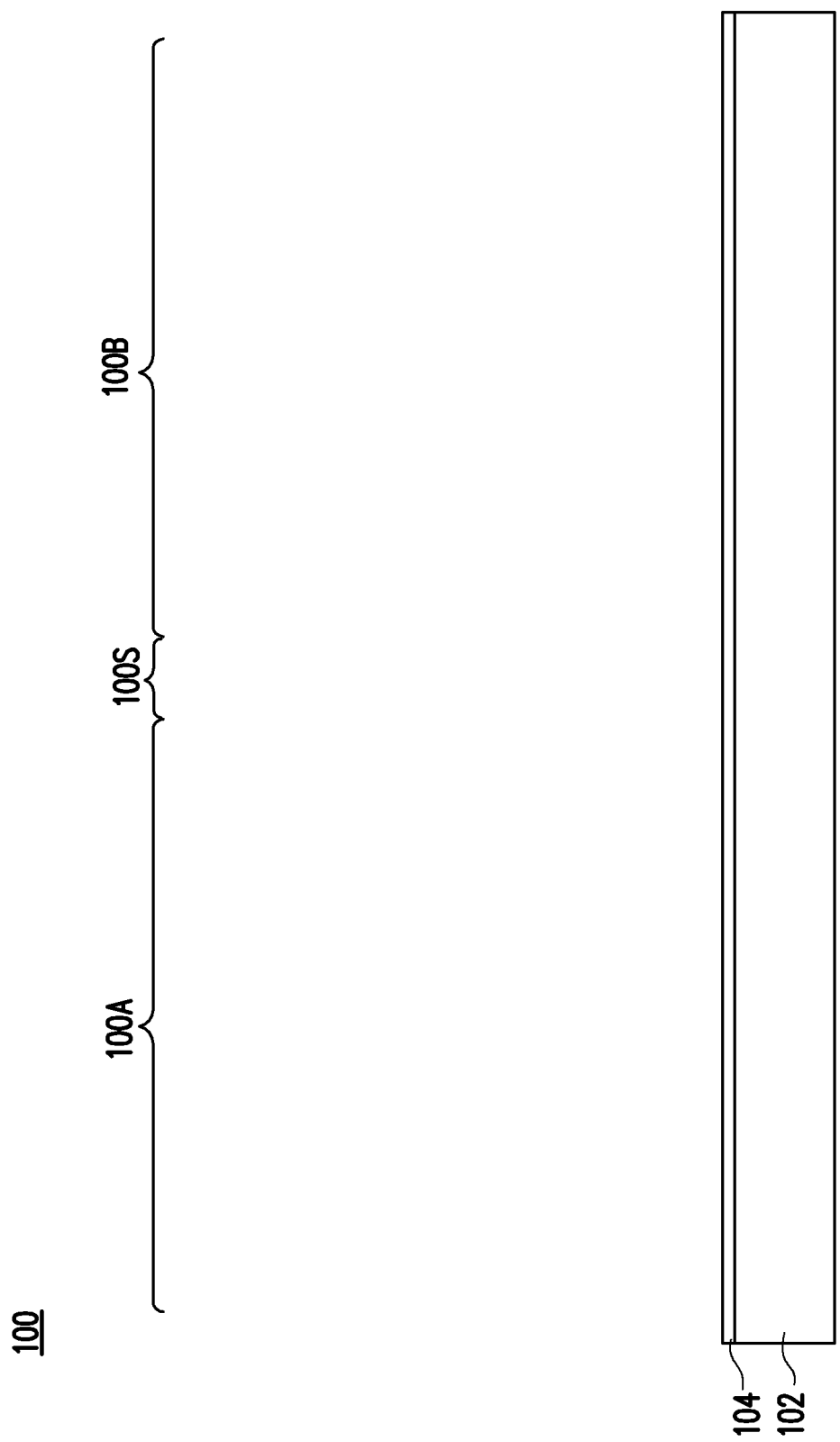
FIGS. 2 through 18 illustrate various views of intermediate steps during a process for forming package components, in accordance with some embodiments.

In FIG. 2, a carrier substrate 102 is provided, and a release layer 104 is formed on the carrier substrate 102. The carrier substrate 102 may be a glass carrier substrate, a ceramic carrier substrate, or the like. The carrier substrate 102 may be a wafer, such that multiple packages can be formed on the carrier substrate 102 simultaneously. The release layer 104 may be formed of a polymer-based material, which may be removed along with the carrier substrate 102 from the overlying structures that will be formed in subsequent steps. In some embodiments, the release layer 104 is an epoxy-based thermal-release material, which loses its adhesive property when heated, such as a light-to-heat-conversion (LTHC) release coating. In other embodiments, the release layer 104 may be an ultra-violet (UV) glue, which loses its adhesive property when exposed to UV lights. The release layer 104 may be dispensed as a liquid and cured, may be a laminate film laminated onto the carrier substrate 102, or may be the like. The top surface of the release layer 104 may be leveled and may have a high degree of planarity.

Figure 3:
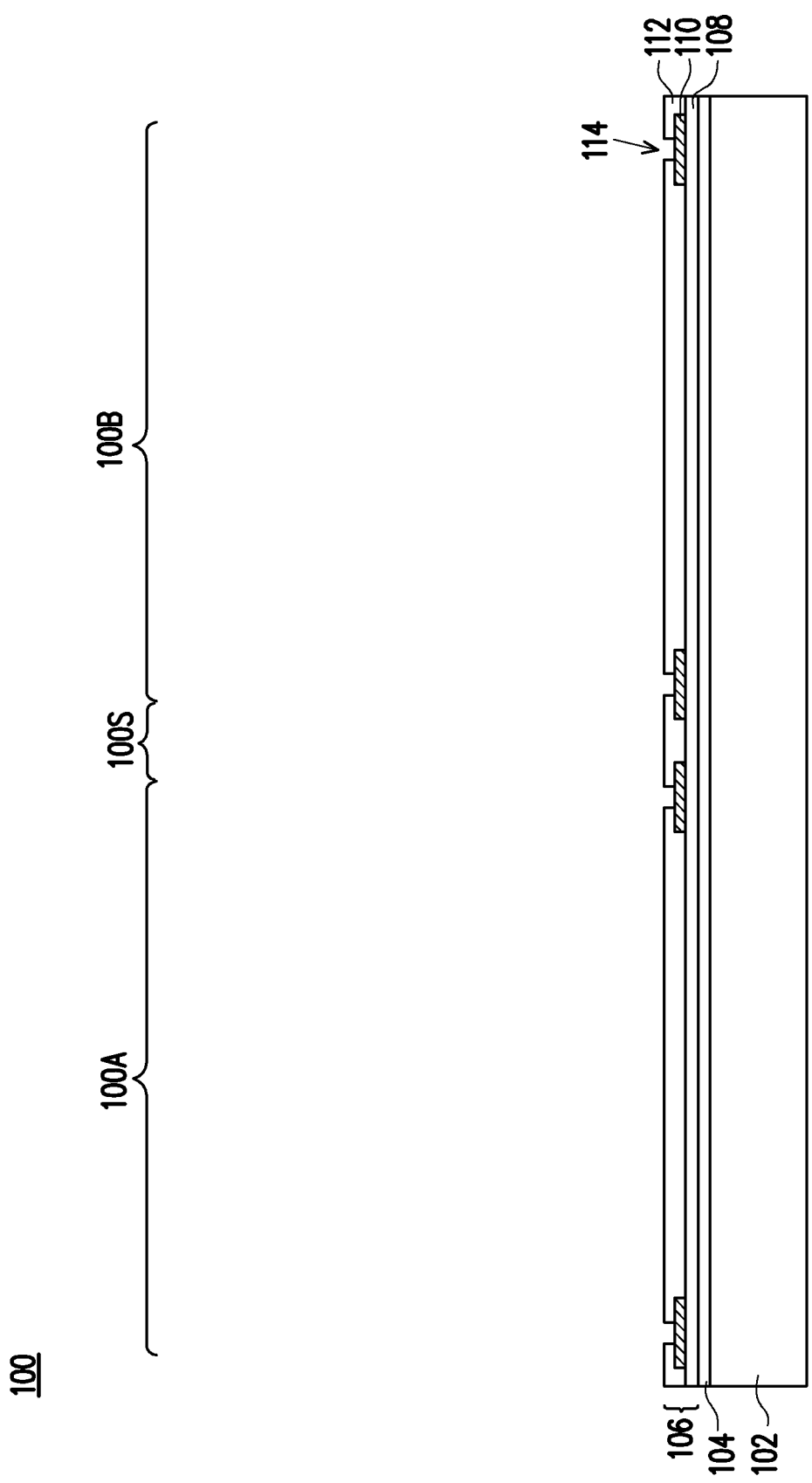

In FIG. 3, a back-side redistribution structure 106 may be formed on the release layer 104. In the embodiment shown, the back-side redistribution structure 106 includes a dielectric layer 108, a metallization pattern 110 (sometimes referred to as redistribution layers or redistribution lines), and a dielectric layer 112. The back-side redistribution structure 106 is optional. In some embodiments, a dielectric layer without metallization patterns is formed on the release layer 104 in lieu of the back-side redistribution structure 106.

The dielectric layer 108 may be formed on the release layer 104. The bottom surface of the dielectric layer 108 may be in contact with the top surface of the release layer 104. In some embodiments, the dielectric layer 108 is formed of a polymer, such as polybenzoxazole (PBO), polyimide, benzocyclobutene (BCB), or the like. In other embodiments, the dielectric layer 108 is formed of a nitride such as silicon nitride; an oxide such as silicon oxide, phosphosilicate glass (PSG), borosilicate glass (BSG), boron-doped phosphosilicate glass (BPSG), or the like; or the like. The dielectric layer 108 may be formed by any acceptable deposition process, such as spin coating, CVD, laminating, the like, or a combination thereof.

The metallization pattern 110 may be formed on the dielectric layer 108. As an example to form metallization pattern 110, a seed layer is formed over the dielectric layer 108. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, physical vapor deposition (PVD) or the like. A photoresist is then formed and patterned on the seed layer. The photoresist may be formed by spin coating or the like and may be exposed to light for patterning. The pattern of the photoresist corresponds to the metallization pattern 110. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the metallization pattern 110.

The dielectric layer 112 may be formed on the metallization pattern 110 and the dielectric layer 108. In some embodiments, the dielectric layer 112 is formed of a polymer, which may be a photo-sensitive material such as PBO, polyimide, BCB, or the like, that may be patterned using a lithography mask. In other embodiments, the dielectric layer 112 is formed of a nitride such as silicon nitride; an oxide such as silicon oxide, PSG, BSG, BPSG; or the like. The dielectric layer 112 may be formed by spin coating, lamination, CVD, the like, or a combination thereof. The dielectric layer 112 is then patterned to form openings 114 exposing portions of the metallization pattern 110. The patterning may be formed by an acceptable process, such as by exposing the dielectric layer 112 to light when the dielectric layer 112 is a photo-sensitive material or by etching using, for example, an anisotropic etch. If the dielectric layer 112 is a photo-sensitive material, the dielectric layer 112 can be developed after the exposure.

It should be appreciated that the back-side redistribution structure 106 may include any number of dielectric layers and metallization patterns. If more dielectric layers and metallization patterns are to be formed, steps and processes discussed above may be repeated. The metallization patterns may include conductive lines and conductive vias. The conductive vias may be formed during the formation of the metallization pattern by forming the seed layer and conductive material of the metallization pattern in the opening of the underlying dielectric layer. The conductive vias may therefore interconnect and electrically couple the various conductive lines.

Figure 4:
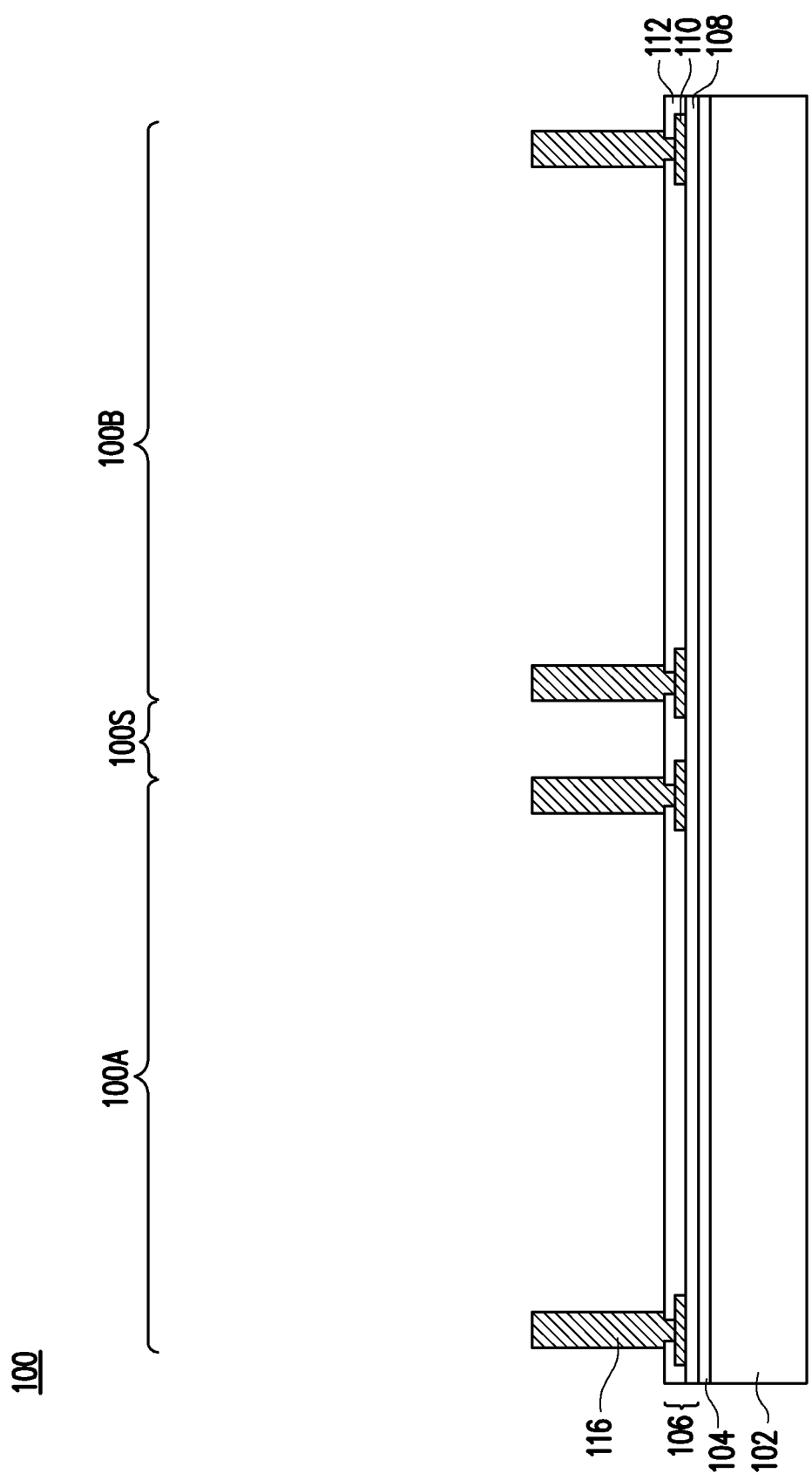

In FIG. 4, through vias 116 may be formed in the openings 114 and extending away from the topmost dielectric layer of the back-side redistribution structure 106 (e.g., the dielectric layer 112). The through vias 116 are optional, and may be omitted, such as in embodiments where the back-side redistribution structure 106 is omitted. As an example to form the through vias 116, a seed layer is formed over the back-side redistribution structure 106, e.g., on the dielectric layer 112 and portions of the metallization pattern 110 exposed by the openings 114. In some embodiments, the seed layer is a metal layer, which may be a single layer or a composite layer comprising a plurality of sub-layers formed of different materials. In a particular embodiment, the seed layer comprises a titanium layer and a copper layer over the titanium layer. The seed layer may be formed using, for example, PVD or the like. A photoresist is formed and patterned on the seed layer. The photoresist may be formed by spin coating or the like and may be exposed to light for patterning. The pattern of the photoresist corresponds to conductive vias. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the through vias 116.

Figure 5:
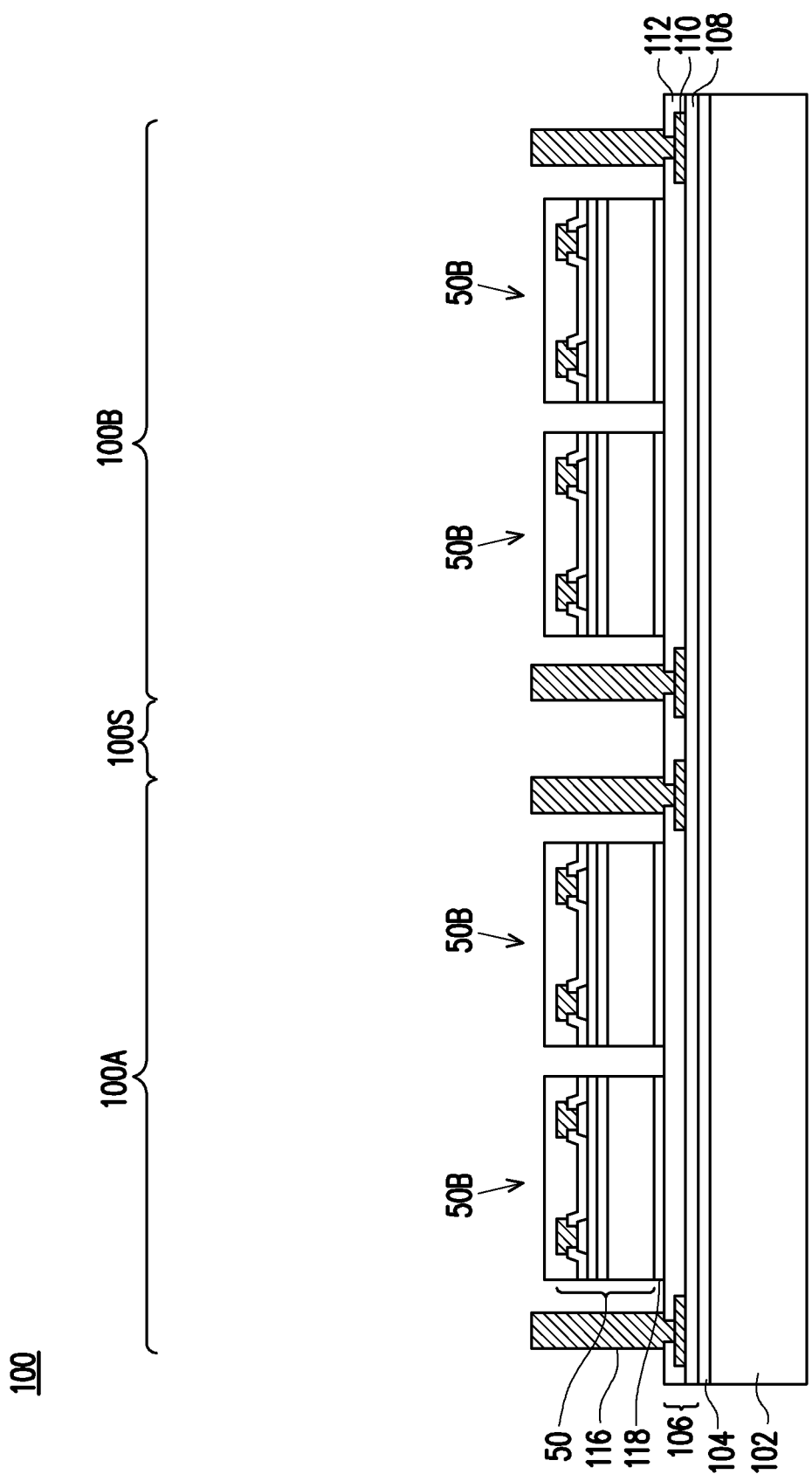

In FIG. 5, integrated circuit dies 50 are adhered to the dielectric layer 112 by an adhesive 118. A desired type and quantity of integrated circuit dies 50 are adhered in each of the package regions 100A and 100B. In the embodiment shown, multiple integrated circuit dies 50 are adhered adjacent one another, including a first integrated circuit die 50A and a second integrated circuit die 50B. The first integrated circuit die 50A may be a logic device, such as a central processing unit (CPU), graphics processing unit (GPU), system-on-a-chip (SoC), microcontroller, or the like. The second integrated circuit die 50B may be a memory device, such as a dynamic random access memory (DRAM) die, static random access memory (SRAM) die, hybrid memory cube (HMC) module, a high bandwidth memory (HBM) module, or the like. In some embodiments, the integrated circuit dies 50A and 50B may be the same type of dies, such as SoC dies. The first integrated circuit die 50A and second integrated circuit die 50B may be formed in processes of a same technology node, or may be formed in processes of different technology nodes. For example, the first integrated circuit die 50A may be of a more advanced process node than the second integrated circuit die 50B. The integrated circuit dies 50A and 50B may have different sizes (e.g., different heights and/or surface areas), or may have the same size (e.g., same heights and/or surface areas). The space available for the through vias 116 in the package regions 100A and 100B may be limited, particularly when the integrated circuit dies 50A and 50B include devices with a large footprint, such as SoCs. Use of the back-side redistribution structure 106 allows for an improved interconnect arrangement when the package regions 100A and 100B have limited space available for the through vias 116.

The adhesive 118 is on back-sides of the integrated circuit dies 50A and 50B and adheres the integrated circuit dies 50A and 50B to the back-side redistribution structure 106, such as to the dielectric layer 112. The adhesive 118 may be any suitable adhesive, epoxy, die attach film (DAF), or the like. The adhesive 118 may be applied to back-sides of the integrated circuit dies 50A and 50B or may be applied over the surface of the carrier substrate 102. For example, the adhesive 118 may be applied to the back-sides of the integrated circuit dies 50A and 50B before singulating to separate the integrated circuit dies 50A and 50B.

Figure 6:
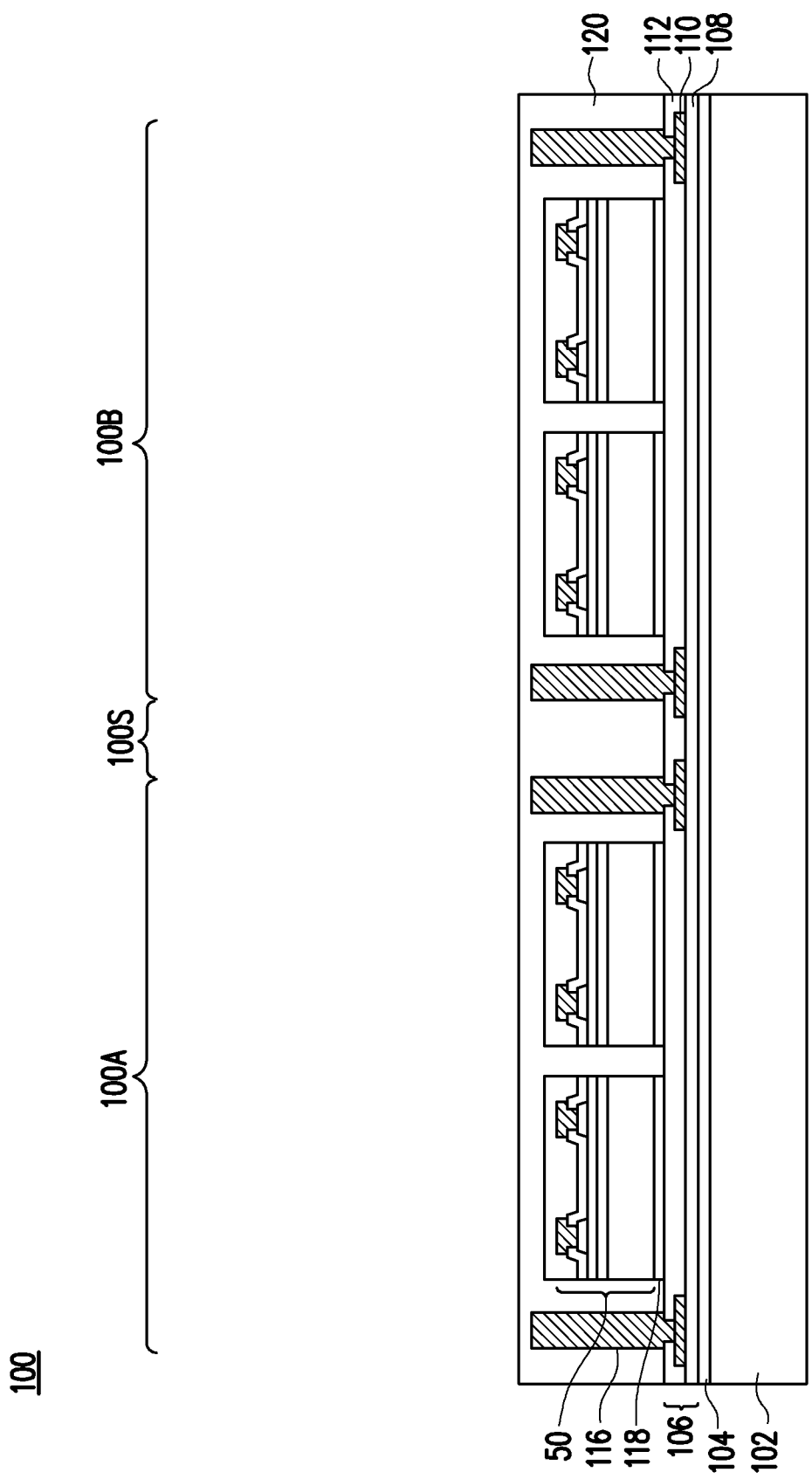

In FIG. 6, an encapsulant 120 is formed on and around the various components. After formation, the encapsulant 120 encapsulates the through vias 116 and integrated circuit dies 50. The encapsulant 120 may be a molding compound, epoxy, or the like. The encapsulant 120 may be applied by compression molding, transfer molding, or the like, and may be formed over the carrier substrate 102 such that the through vias 116 and/or the integrated circuit dies 50 are buried or covered. The encapsulant 120 is further formed in gap regions between the integrated circuit dies 50, if present. The encapsulant 120 may be applied in liquid or semi-liquid form and then subsequently cured.

Figure 7:
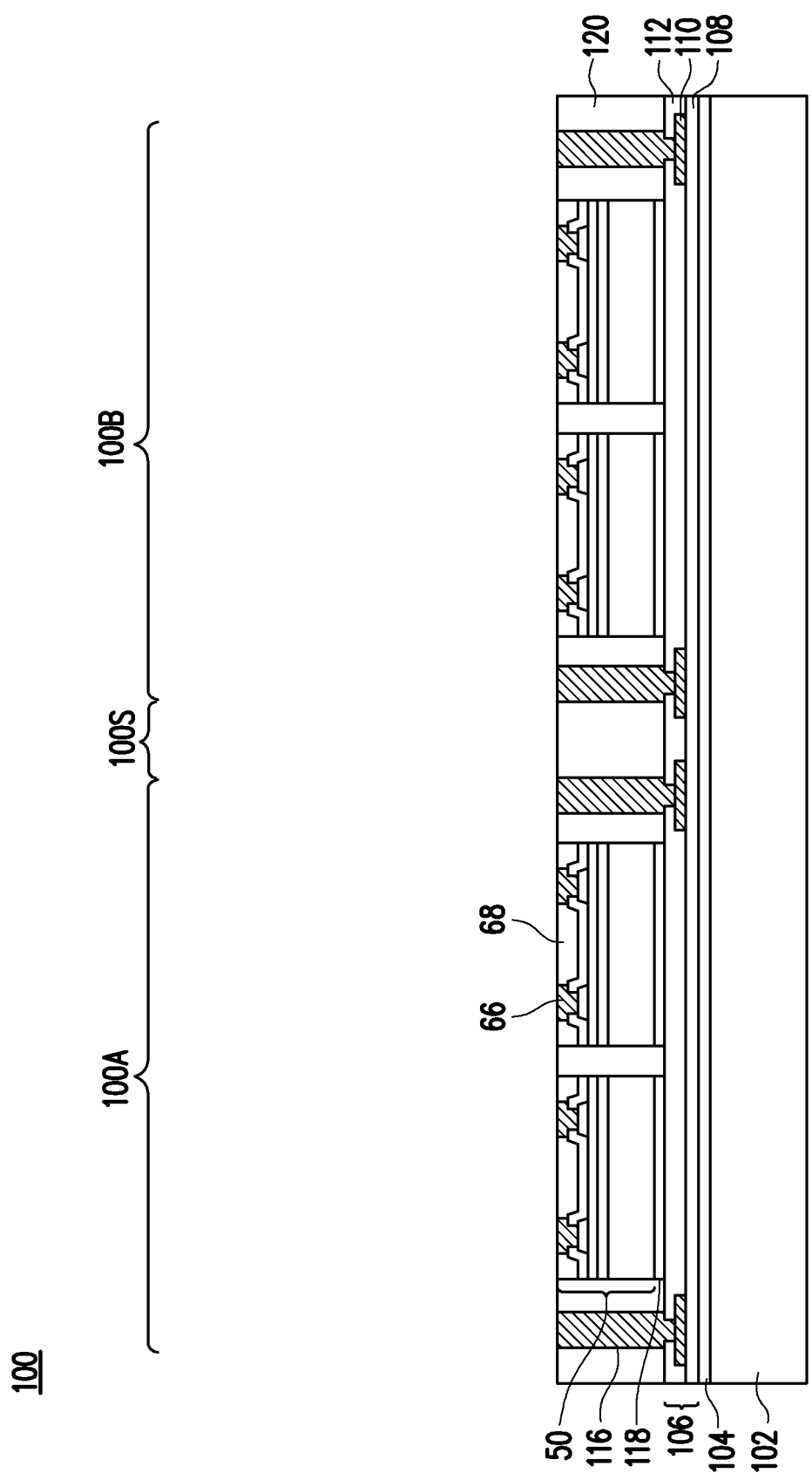

In FIG. 7, a planarization process is performed on the encapsulant 120 to expose the through vias 116 and the die connectors 66. The planarization process may also remove material of the through vias 116, dielectric layer 68, and/or die connectors 66 until the die connectors 66 and through vias 116 are exposed. Top surfaces of the through vias 116, die connectors 66, dielectric layer 68, and encapsulant 120 are coplanar after the planarization process. The planarization process may be, for example, a chemical-mechanical polish (CMP), a grinding process, or the like. In some embodiments, the planarization may be omitted, for example, if the through vias 116 and/or die connectors 66 are already exposed.

Figure 8:
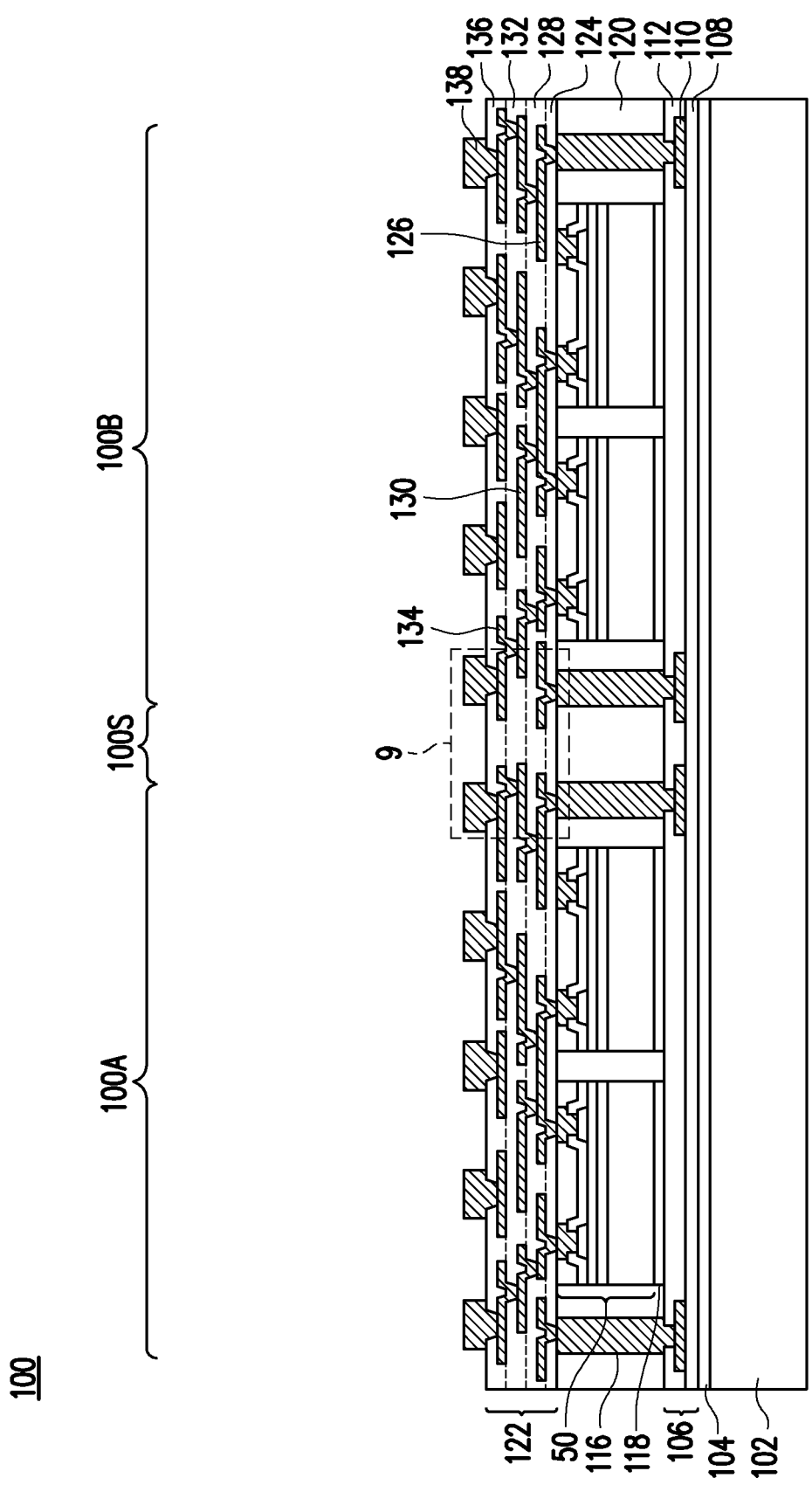

In FIG. 8, a front-side redistribution structure 122 is formed over the encapsulant 120, through vias 116, and integrated circuit dies 50. The front-side redistribution structure 122 includes dielectric layers 124, 128, 132, and 136; and metallization patterns 126, 130, and 134; and UBMs 138. The metallization patterns may also be referred to as redistribution layers or redistribution lines. The front-side redistribution structure 122 is shown as an example having three layers of metallization patterns. More or fewer dielectric layers and metallization patterns may be formed in the front-side redistribution structure 122. If fewer dielectric layers and metallization patterns are to be formed, steps and process discussed below may be omitted. If more dielectric layers and metallization patterns are to be formed, steps and processes discussed below may be repeated.

FIGS. 9A through 9E illustrate further details of an example process for forming the front-side redistribution structure 122. A region 9 in FIG. 8 is shown in more detail, although it should be appreciated that the front-side redistribution structure 122 is formed on all regions of the first package component 100. Sealing rings 140 (see Figure ii) are formed concurrently with the metallization patterns 126, 130, 134 and UBMs 138. FIG. 10 illustrates the front-side redistribution structure 122, including the sealing rings 140, in a top-down view, and is described concurrently with FIGS. 9A through 9E. The various portions of the sealing rings 140 are not shown in FIG. 8, 12-16, or 19, for simplicity of illustration.

Each of the package regions (e.g., 100A and 100B) includes one sealing ring 140 surrounding the metallization patterns 126, 130, 134 and UBMs 138 in that package region. The sealing rings 140 are electrically non-functional, e.g., are electrically isolated from the integrated circuit dies 50, the metallization patterns 126, 130, and 134, and the UBMs 138. The metallization patterns 126, 130, 134 and UBMs are formed in central regions 122C of the front-side redistribution structure 122, and the sealing rings 140 are formed in edge regions 122E of the front-side redistribution structure 122. Each of the edge regions 122E surrounds a respective one of the central regions 122C, and extends from the respective central region 122C to an edge of the respective package region. The front-side redistribution structure 122 will be singulated during subsequent processing by cutting in the scribe line region 100S. Cutting can induce cracking and delamination in the front-side redistribution structure 122. The sealing rings 140 physically separate the metallization patterns 126, 130, 134 and UBMs 138 from the scribe line region 100S, and can stop the cut-induced cracks from spreading, which can also help reduce delamination in the front-side redistribution structure 122.

Figure 9A:
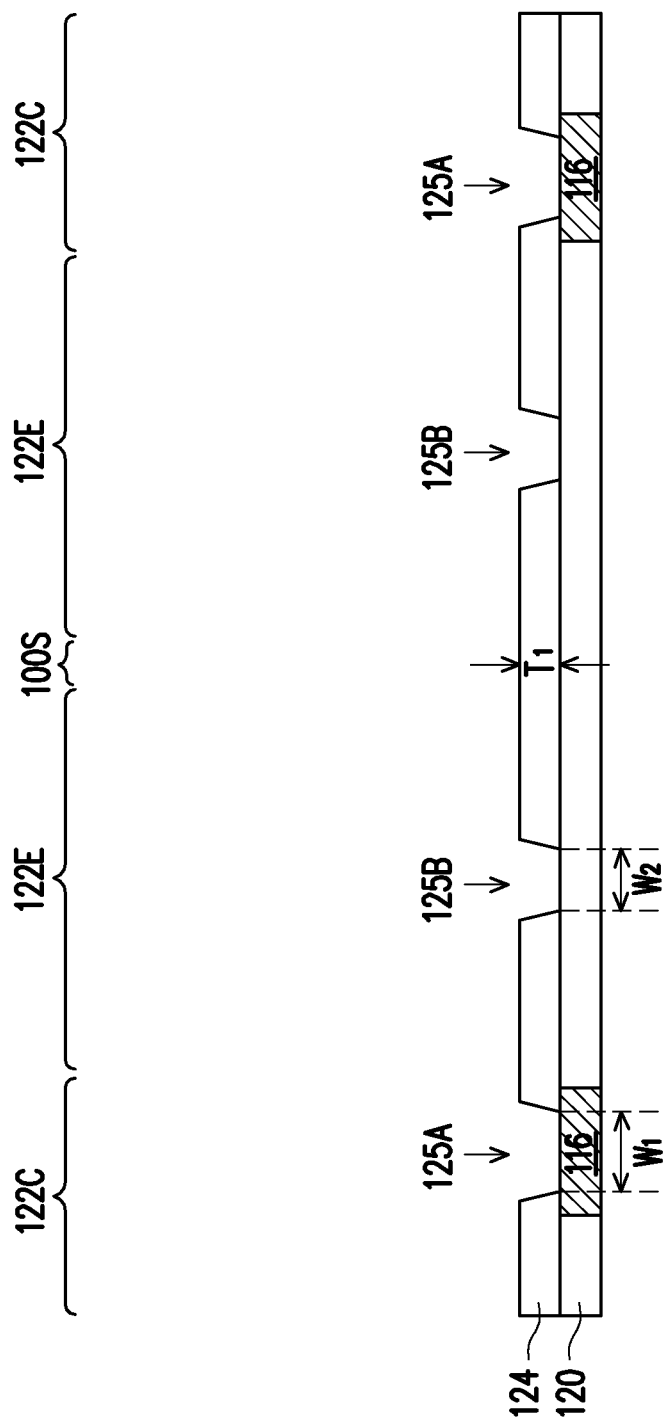

In FIG. 9A, the dielectric layer 124 is deposited on the encapsulant 120, through vias 116, and die connectors 66. In some embodiments, the dielectric layer 124 is formed of a photo-sensitive material such as PBO, polyimide, BCB, or the like, which may be patterned using a lithography mask. The dielectric layer 124 may be formed by spin coating, lamination, CVD, the like, or a combination thereof. The dielectric layer 124 is formed to thickness $T_1$, which can be in the range of about 3 μm to about 5 μm.

The dielectric layer 124 is then patterned. The patterning forms openings 125A and 125B. The openings 125A are in the central regions 122C of the front-side redistribution structure 122, and expose portions of the through vias 116 and the die connectors 66 (not shown). The openings 125B are in the edge regions 122E of the front-side redistribution structure 122, and expose portions of the encapsulant 120. The patterning may be by an acceptable process, such as by exposing the dielectric layer 124 to light when the dielectric layer 124 is a photo-sensitive material or by etching using, for example, an anisotropic etch. If the dielectric layer 124 is a photo-sensitive material, the dielectric layer 124 can be developed after the exposure.

The openings 125A have a width $W_1$ and the openings 125B have a width $W_2$. The width $W_1$ is larger than the width $W_2$. Notably, the width $W_2$ is small, such that subsequently formed vias for the sealing rings 140 have a small width-to-height aspect ratio. For example, the width $W_1$ can be in the range of about 7 μm to about 50 μm, such as about 14 μm, and the width $W_2$ can be in the range of about 7 μm to about 25 μm, such as about 7 μm.

Figure 9B:
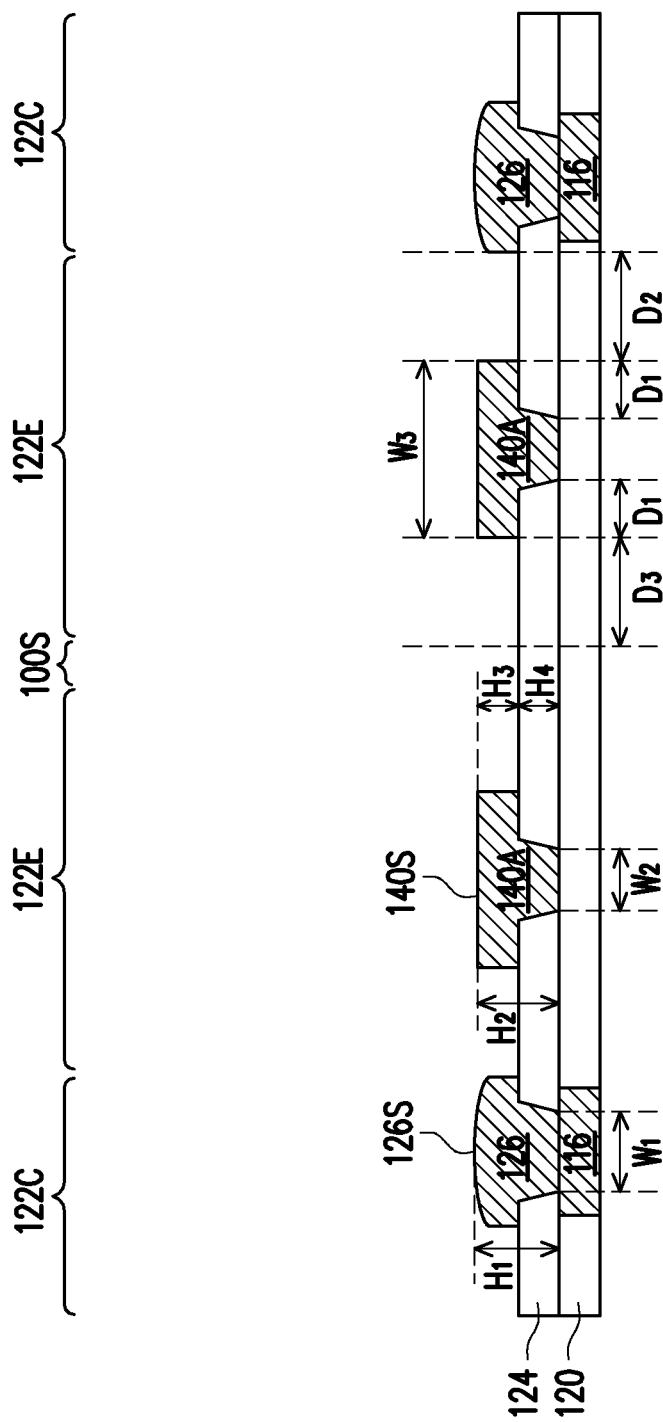

In FIG. 9B, the metallization pattern 126 and first layers 140A of the sealing rings 140 are concurrently formed. The metallization pattern 126 and the first sealing ring layers 140A include line portions (also referred to as conductive lines) on and extending along the major surface of the dielectric layer 124. The metallization pattern 126 and the first sealing ring layers 140A further include via portions (also referred to as conductive vias) extending through the dielectric layer 124 to physically and electrically couple the through vias 116 and the integrated circuit dies 50. As an example to form the metallization pattern 126 and the first sealing ring layers 140A, a seed layer is formed over the dielectric layer 124 and in the openings 125A and 125B extending through the dielectric layer 124. In some embodiments, the seed layer is a metal layer, which may be a single layer or a composite layer comprising a plurality of sublayers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the metallization pattern 126 and the first sealing ring layers 140A. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the metallization pattern 126 and the first sealing ring layers 140A. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

The metallization pattern 126 has an overall height $H_1$, and the first sealing ring layers 140A have an overall height $H_2$. The height $H_2$ is large, such that the via portions of the first sealing ring layers 140A have a small width-to-height aspect ratio. Further, the height $H_1$ is larger than the height $H_2$. For example, the height $H_1$ can be in the range of about 10 μm to about 20 μm, such as about 20 μm, and the height $H_2$ can be in the range of about 6.4 μm to about 10 μm, such as about 6.4 μm. The line portions of the first sealing ring layers 140A also have a height $H_3$, which is small. For example, the height $H_3$ can be in the range of about 1.4 μm to about 5 μm, such as about 1.4 μm. The via portions of the first sealing ring layers 140A also have a height $H_4$, which is equal to the thickness $T_1$.

The ratio of the height $H_2$ to the height $H_3$ is large. For example, the $H_2$:$H_3$ ratio can be greater than 2, such as in the range of about 2 to about 4.6. In other words, the via height $H_4$ is greater than the line height $H_3$. Forming the first sealing ring layers 140A with a large $H_2$:$H_3$ ratio helps the dielectric layer 124 more fully develop when patterning the openings 125A and 125B, reducing the formation of voids in the first sealing ring layers 140A. However, increasing the $H_2$:$H_3$ ratio results in a decrease of the ratio of the width $W_2$ to the height $H_3$. In other words, when the $H_2$:$H_3$ ratio is large, the $W_2$:$H_3$ ratio is small. For example, the $W_2$:$H_3$ ratio can be less than 5, such as in the range of about 1 to about 5. In accordance with some embodiments, a plating process is used to form the metallization pattern 126 and the first sealing ring layers 140A, and the parameters of the plating process are selected to help the openings 125B be more fully filled despite the small $W_2$:$H_2$ ratio. The plating process is performed with a plating solution that includes both an accelerator and a suppressor. For example, the accelerator can be mercaptopropylsulfonic acid (MPS), bis(sodiumsulfopropyl)disulfide (SPS), or the like, and the suppressor can be a polymer derived from polyethylene oxide (PEO), polypropylene oxide (PPO), polyethylene glycol (PEG), polypropylene glycol (PPG), or the like. The accelerator can be at a concentration of about 1 mL/L, the suppressor can be at a concentration of about 2 mL/L, and the concentration ratio of the accelerator and the suppressor can be about 1:2. The plating process is performed at a high current density. For example, the current density can be in the range of about 1 A/dm² to about 7 A/dm², such as about 7 A/dm². The selected current density and the concentration ratio of the accelerator and the suppressor can influence the behavior of the plating solution accelerator and suppressor, with a high current density causing a high acceleration behavior, thereby inducing an overpotential difference between lower regions and upper regions of the openings 125A and 125B. Inducing an overpotential difference between lower regions and upper regions of the openings 125A and 125B causes the plating process to have a high plating speed in the lower regions of the openings 125A and 125B, and causes the plating process to have a low plating speed in the upper regions of the openings 125A and 125B. The plating process is performed at a low agitation speed. For example, the agitation speed can be in the range of about 0 RPM to about 50 RPM, such as about 50 RPM. The plating process is performed at a low temperature. For example, the temperature can be in the range of about 22° C. to about 25° C., such as about 22° C. A low agitation speed and low temperature can also induce an overpotential difference between the lower regions and the upper regions of the openings 125A and 125B, thereby increasing the plating speed in the lower regions of the openings 125A and 125B.

In some embodiments, an anneal is performed after the plating process. The anneal may be performed at a temperature in the range of about 170° C. to about 240° C., such as about 240° C., and may be performed for a duration in the range of about 60 minutes to about 120 minutes, such as about 60 minutes. Performing the anneal may improve the mechanical strength of the first sealing ring layers 140A.

Because the widths $W_1$ of the openings 125A are larger than the widths $W_2$ of the openings 125B, the plating process forms conductive features of different shapes in the openings 125A and 125B. In particular, the first sealing ring layers 140A have flat (e.g., planar) topmost surfaces 140S, and the features of the metallization pattern 126 have convex topmost surfaces 126S. In other embodiments (discussed below), the first sealing ring layers 140A can have concave (e.g., non-planar) topmost surfaces 140S.

The line portions of the first sealing ring layers 140A have an overall width $W_3$. The width $W_3$ is small. For example, the width $W_3$ can be in the range of about 11 μm to about 13 μm, such as about 13 μm. Further, the line portions of the first sealing ring layers 140A overhang the via portions of the first sealing ring layers 140A by a distance $D_1$. The distance $D_1$ is small. For example, the distance $D_1$ can be about 3 μm. By forming the line portions of the first portions 140A with a small width and a small overhang, the area occupied by the sealing rings 140, and thus the overall size of the package regions 100A/100B, may be reduced.

Buffer regions are provided in the edge regions 122E of the front-side redistribution structure 122, to help further separate the central regions 122C of the front-side redistribution structure 122 from the scribe line region 100S. The first sealing ring layers 140A are formed to be separated from the conductive features of the metallization pattern 126 by at least a distance $D_2$. The distance $D_2$ can be in the range of about 20 μm to about 30 μm, such as about 20 μm. Likewise, the first sealing ring layers 140A are formed to be separated from the scribe line region 100S by at least a distance $D_3$. The distance $D_3$ can be in the range of about 10 μm to about 20 μm, such as about 20 μm. Separating the sealing rings 140 from the central regions 122C of the front-side redistribution structure 122 and the scribe line region 100S by, respectively the distances $D_2$ and $D_3$, allows sufficient area to absorb cut-induced cracks that may formed.

Figure 9C:
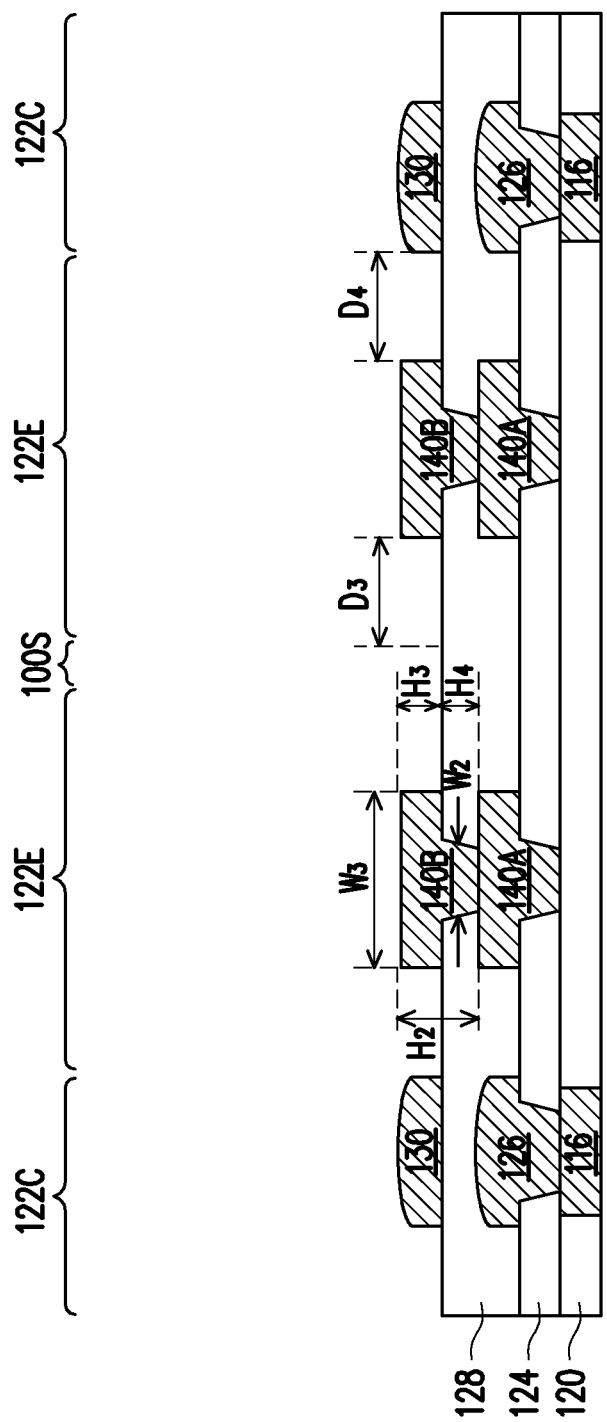

In FIG. 9C, the dielectric layer 128 is deposited on the metallization pattern 126, first sealing ring layers 140A, and dielectric layer 124. The dielectric layer 128 may be formed in a manner similar to the dielectric layer 124, and may be formed of a similar material as the dielectric layer 124. Although the topmost surface of the dielectric layer 128 is shown as being planar, it should be appreciated that the surface may be non-planar due to the convex shape of the metallization pattern 130.

The metallization pattern 130 and second layers 140B of the sealing rings 140 are then concurrently formed. The metallization pattern 130 and second sealing ring layers 140B include line portions on and extending along the major surface of the dielectric layer 128. The metallization pattern 130 and second sealing ring layers 140B further include via portions extending through the dielectric layer 128 to physically and electrically couple the metallization pattern 126 and first sealing ring layers 140A, respectively. The metallization pattern 130 and second sealing ring layers 140B may be formed in a similar manner and of a similar material as the metallization pattern 126 and first sealing ring layers 140A. In some embodiments, the metallization pattern 130 has a different size than the metallization pattern 126. For example, the conductive lines and/or vias of the metallization pattern 130 may be wider or thicker than the conductive lines and/or vias of the metallization pattern 126. Further, the metallization pattern 130 may be formed to a greater pitch than the metallization pattern 126. Conversely, the second sealing ring layers 140B are the same size as the first sealing ring layers 140A. In particular, the second sealing ring layers 140B have the same overall height $H_2$, via width $W_2$, via height $H_4$, line width $W_3$, and line height $H_3$ as the first sealing ring layers 140A. Further, the second sealing ring layers 140B are separated from the scribe line region 100S by at least the distance $D_3$, and are separated from the conductive features of the metallization pattern 130 by a distance $D_4$. In embodiments where the conductive features of the metallization pattern 130 are smaller than the conductive features of the metallization pattern 126, the distance $D_4$ is greater than the distance $D_2$ (see FIG. 9B). In embodiments where the conductive features of the metallization pattern 130 are larger than the conductive features of the metallization pattern 126, the distance $D_4$ is less than the distance $D_2$ (see FIG. 9B). The distance $D_4$ can be in the range of about 20 μm to about 30 μm, such as about 20 μm.

The via portions of the metallization pattern 130 are coupled to the line portions of the metallization pattern 126 (see FIG. 8). In other words, the via portions of the metallization patterns 126 and 130 are aligned along different axes (see FIG. 8), with those axes being perpendicular to the major surface of the encapsulant 120. Conversely, the via portions of the first sealing ring layers 140A and second sealing ring layers 140B are aligned along a same common axis, with that axis being perpendicular to the major surface of the encapsulant 120. Stacking the via portions of the first sealing ring layers 140A and second sealing ring layers 140B reduces the lateral width of the resulting sealing rings 140. The area occupied by the sealing rings 140, and thus the overall size of the package regions 100A/100B, may be reduced.

Figure 9D:
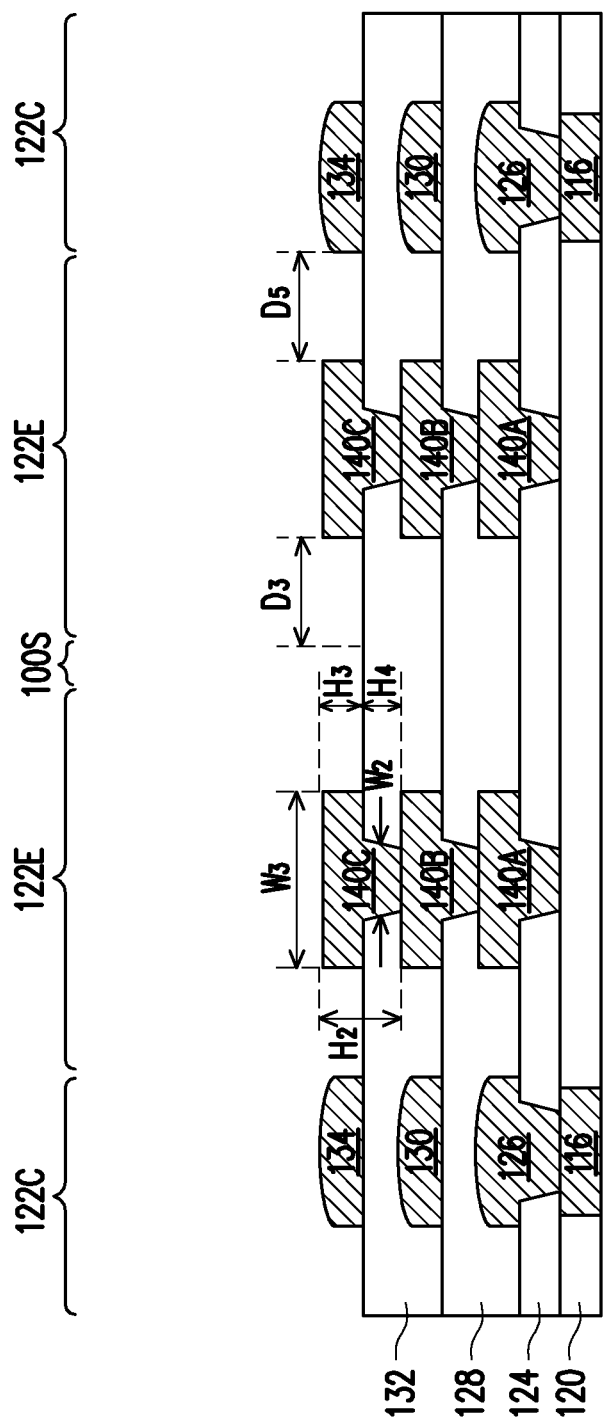

In FIG. 9D, the dielectric layer 132 is deposited on the metallization pattern 130, second sealing ring layers 140B, and dielectric layer 128. The dielectric layer 132 may be formed in a manner similar to the dielectric layer 124, and may be formed of a similar material as the dielectric layer 124.

The metallization pattern 134 and third layers 140C of the sealing rings 140 are then concurrently formed. The metallization pattern 134 includes line portions on and extending along the major surface of the dielectric layer 132. The metallization pattern 134 further includes via portions extending through the dielectric layer 132 to physically and electrically couple the metallization pattern 130. The metallization pattern 134 may be formed in a similar manner and of a similar material as the metallization pattern 126. In some embodiments, the metallization pattern 134 has a different size than the metallization patterns 126 and 130. For example, the conductive lines and/or vias of the metallization pattern 134 may be wider or thicker than the conductive lines and/or vias of the metallization patterns 126 and 130. Further, the metallization pattern 134 may be formed to a greater pitch than the metallization pattern 130. Conversely, the third sealing ring layers 140C are the same size as the first sealing ring layers 140A and the second sealing ring layers 140B. In particular, the third sealing ring layers 140C have the same overall height $H_2$, via width $W_2$, via height $H_4$, line width $W_3$, and line height $H_3$ as the first sealing ring layers 140A and the second sealing ring layers 140B. Further, the third sealing ring layers 140C are separated from the scribe line region 100S by at least the distance $D_3$, and are separated from the conductive features of the metallization pattern 134 by a distance $D_5$. In embodiments where the conductive features of the metallization pattern 134 are smaller than the conductive features of the metallization pattern 130, the distance $D_5$ is greater than the distance $D_4$ (see FIG. 9C). In embodiments where the conductive features of the metallization pattern 134 are larger than the conductive features of the metallization pattern 130, the distance $D_5$ is less than the distance $D_4$ (see FIG. 9C). The distance $D_5$ can be in the range of about 20 μm to about 30 μm, such as about 20 μm.

The via portions of the metallization pattern 134 are coupled to the line portions of the metallization pattern 130 (see FIG. 8). In other words, the via portions of the metallization patterns 126, 130, and 134 are aligned along different axes, with those axes being perpendicular to the major surface of the encapsulant 120. Conversely, the via portions of the first sealing ring layers 140A, second sealing ring layers 140B, and third sealing ring layers 140C are aligned along a same common axis, with that axis being perpendicular to the major surface of the encapsulant 120. Stacking the via portions of the first sealing ring layers 140A, second sealing ring layers 140B, and third sealing ring layers 140C reduces the lateral width of the resulting sealing rings 140. The area occupied by the sealing rings 140, and thus the overall size of the package regions 100A/100B, may be reduced. The overall amount of package regions that may be formed on a single carrier substrate 102 may thus be increased.

Figure 9E:
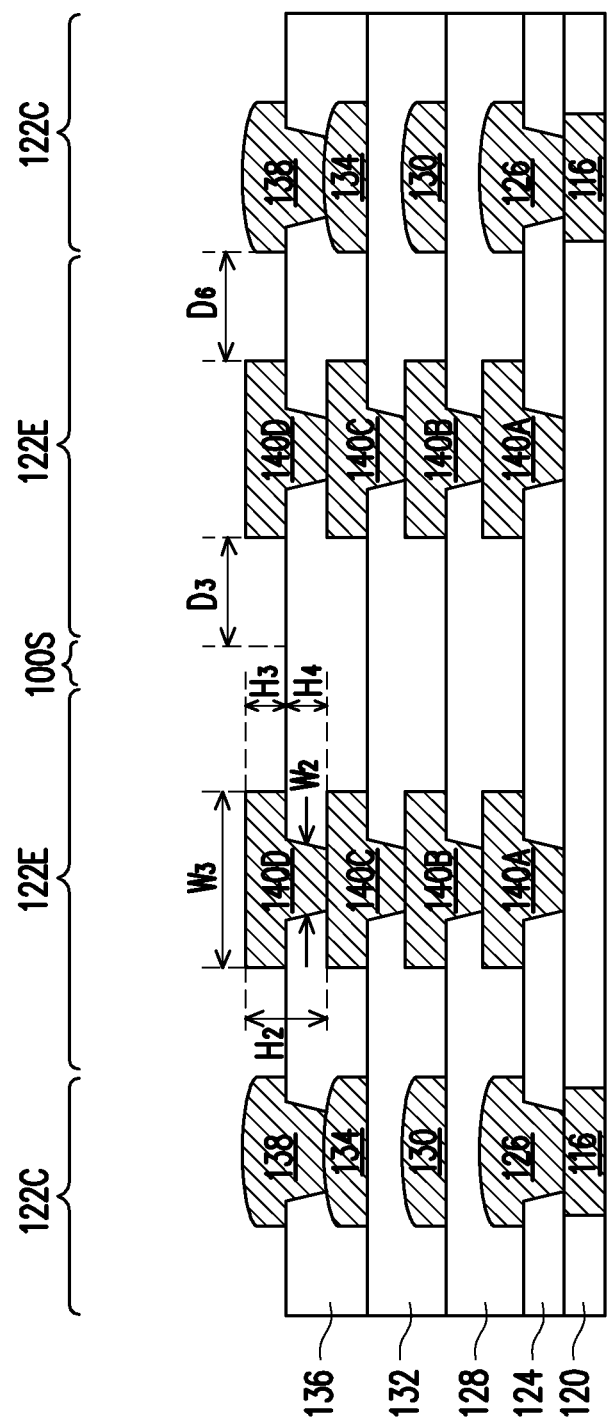

In FIG. 9E, the dielectric layer 136 is deposited on the metallization pattern 134, third sealing ring layers 140C, and dielectric layer 132. The dielectric layer 136 may be formed in a manner similar to the dielectric layer 124, and may be formed of a similar material as the dielectric layer 124.

The UBMs 138 and fourth layers 140D of the sealing rings 140 are then concurrently formed. The UBMs 138 are for external connection to the front-side redistribution structure 122. The UBMs 138 have bump portions on and extending along the major surface of the dielectric layer 136, and have via portions extending through the dielectric layer 136 to physically and electrically couple the metallization pattern 134. As a result, the UBMs 138 are electrically coupled to the through vias 116 and the integrated circuit dies 50. The UBMs 138 may be formed of a similar material as the metallization pattern 126. In some embodiments, the UBMs 138 have a different size than the metallization patterns 126, 130, and 134. The fourth sealing ring layers 140D are the same size as the first sealing ring layers 140A, the second sealing ring layers 140B, and the third sealing ring layers 140C. In particular, the fourth sealing ring layers 140D have the same overall height $H_2$, via width $W_2$, via height $H_4$, line width $W_3$, and line height $H_3$ as the first sealing ring layers 140A, the second sealing ring layers 140B, and the third sealing ring layers 140C. Further, the fourth sealing ring layers 140D are separated from the scribe line region 100S by at least the distance $D_3$, and are separated from UBMs 138 by a distance $D_6$. In embodiments where UBMs 138 are smaller than the conductive features of the metallization pattern 134, the distance $D_6$ is greater than the distance $D_5$ (see FIG. 9D). In embodiments where UBMs 138 are larger than the conductive features of the metallization pattern 134, the distance $D_6$ is less than the distance $D_5$ (see FIG. 9D). The distance $D_6$ can be in the range of about 20 µm to about 30 µm, such as about 20 µm.

The fourth sealing ring layers 140D are optional. When the fourth sealing ring layers 140D are formed, the resulting sealing ring 140 is exposed by the dielectric layer 136. As such, the topmost surface of the resulting sealing ring 140 extends above the topmost surface of the dielectric layer 136. In other embodiments (discussed below), the fourth sealing ring layers 140D are omitted such that the resulting sealing ring 140 is buried beneath the dielectric layer 136. As such, the topmost surface of the dielectric layer 136 extends above the topmost surface of the resulting sealing ring 140.

FIG. 10 is a top-down view of the front-side redistribution structure 122. After formation of the front-side redistribution structure 122 is complete, the sealing rings 140 each surround a respective central region 122C of the front-side redistribution structure 122. Each package region includes one sealing ring 140. FIG. 11 is a three-dimensional cutaway view of a region 11 in FIG. 10. The sealing rings 140 are stacked via structures, where each layer (e.g., stacked via) of a sealing ring 140 is formed of a continuous conductive material. As such, the opening in each dielectric layer 124, 128, 132, and 136 for the sealing ring 140 is a trench that extends continuously around the associated central region 122C of the front-side redistribution structure 122.

Figure 12:
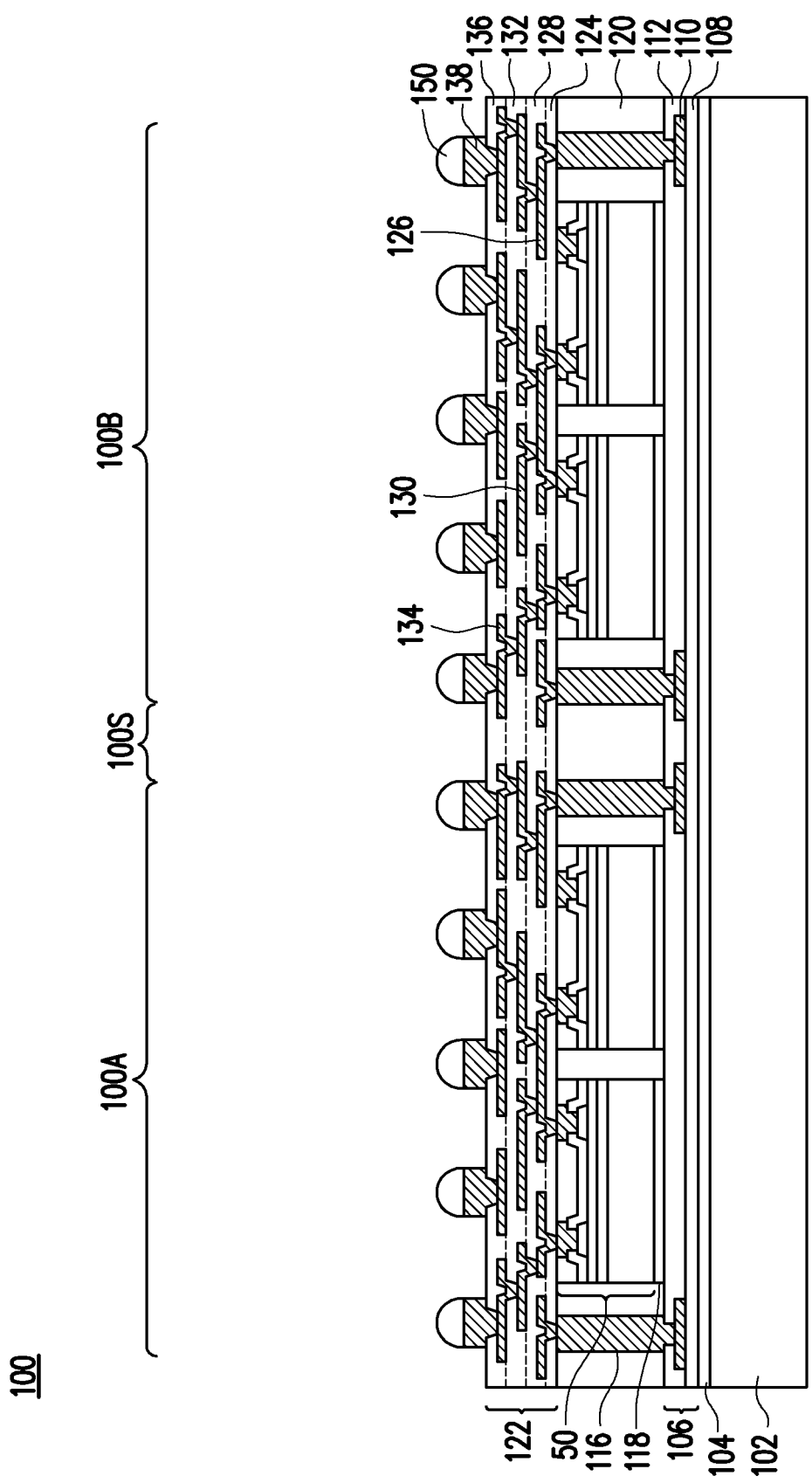

In FIG. 12, conductive connectors 150 are formed on the UBMs 138. In some embodiments, the conductive connectors 150 are not formed on exposed portions of the sealing ring 140. The conductive connectors 150 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 150 may include a conductive material such as solder, copper, aluminum, gold, nickel, silver, palladium, tin, the like, or a combination thereof. In some embodiments, the conductive connectors 150 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 150 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Figure 13:
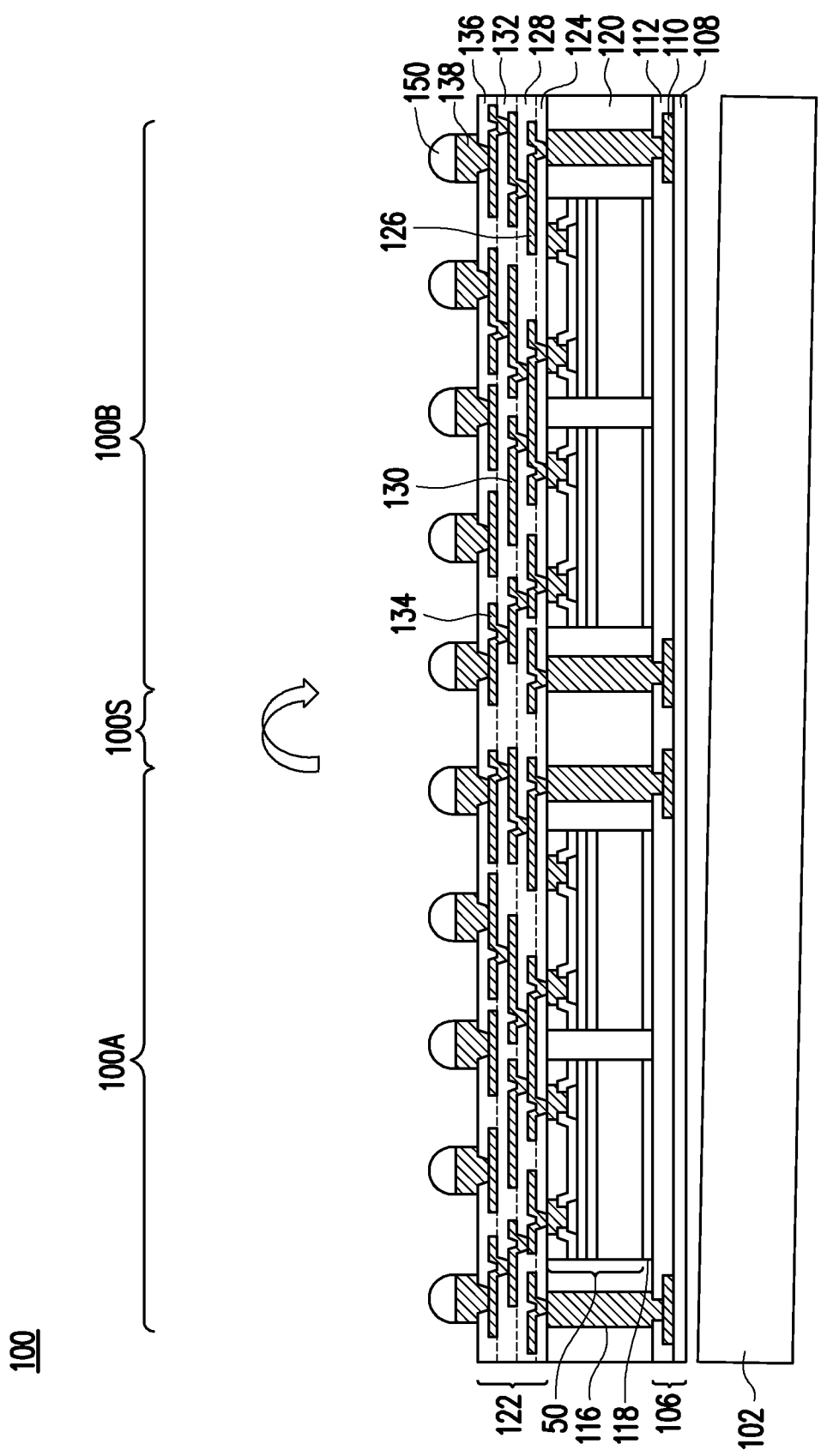

In FIG. 13, a carrier substrate de-bonding is performed to detach (or "de-bond") the carrier substrate 102 from the back-side redistribution structure 106, e.g., the dielectric layer 108. In accordance with some embodiments, the de-bonding includes projecting a light such as a laser light or an UV light on the release layer 104 so that the release layer 104 decomposes under the heat of the light and the carrier substrate 102 can be removed. The structure is then flipped over and placed on a tape.

Figure 14:
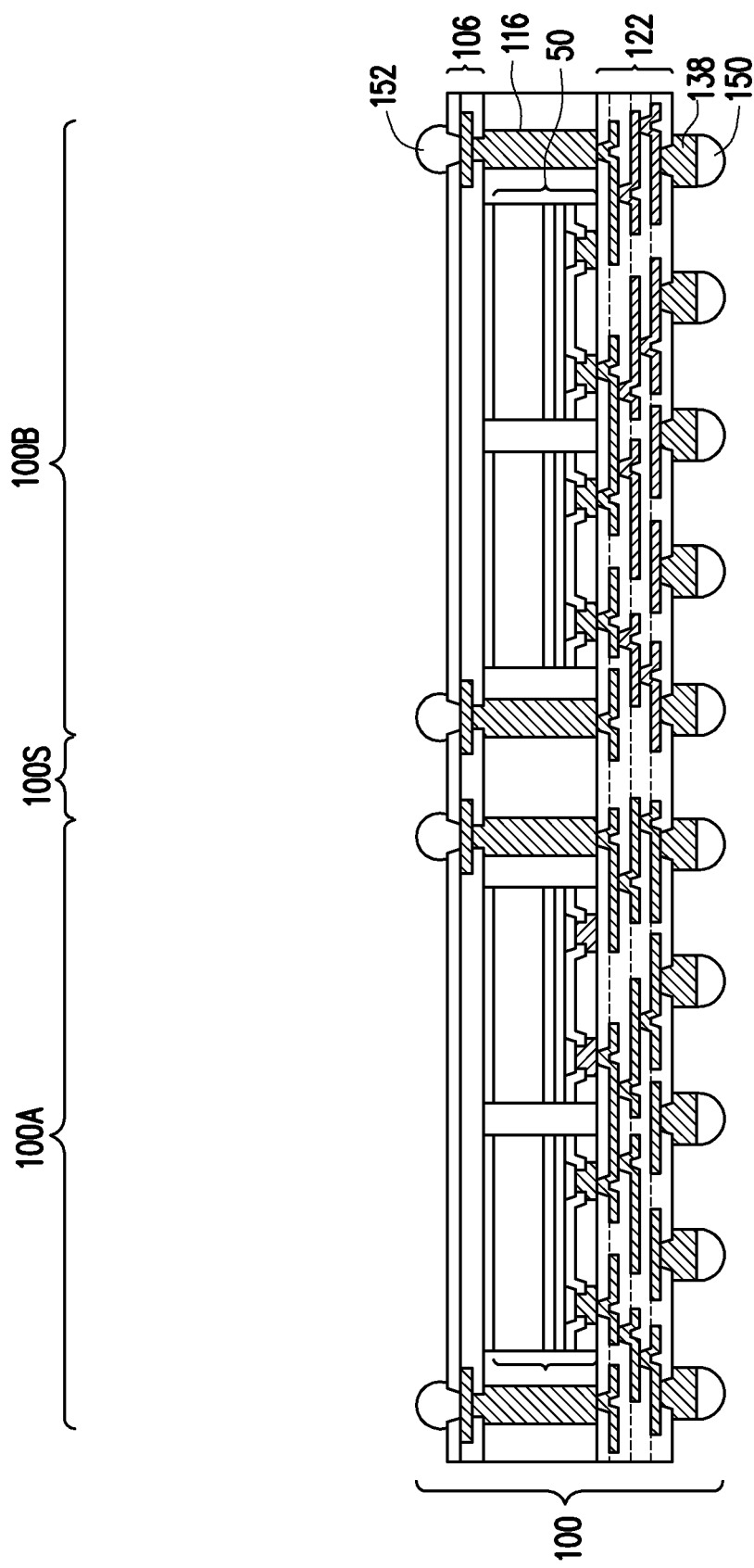

In FIG. 14, conductive connectors 152 are formed extending through the dielectric layer 108 to contact the metallization pattern 110. Openings are formed through the dielectric layer 108 to expose portions of the metallization pattern 110. The openings may be formed, for example, using laser drilling, etching, or the like. The conductive connectors 152 are formed in the openings. In some embodiments, the conductive connectors 152 comprise flux and are formed in a flux dipping process. In some embodiments, the conductive connectors 152 comprise a conductive paste such as solder paste, silver paste, or the like, and are dispensed in a printing process. In some embodiments, the conductive connectors 152 are formed in a manner similar to the conductive connectors 150, and may be formed of a similar material as the conductive connectors 150.

FIGS. 15 through 20 illustrate formation and implementation of device stacks, in accordance with some embodiments. The device stacks are formed from the integrated circuit packages formed in the first package component 100. The device stacks may also be referred to as package-on-package (PoP) structures. Because the PoP structures include InFO packages, they may also be referred to as an InFO-PoP structures.

Figure 15:
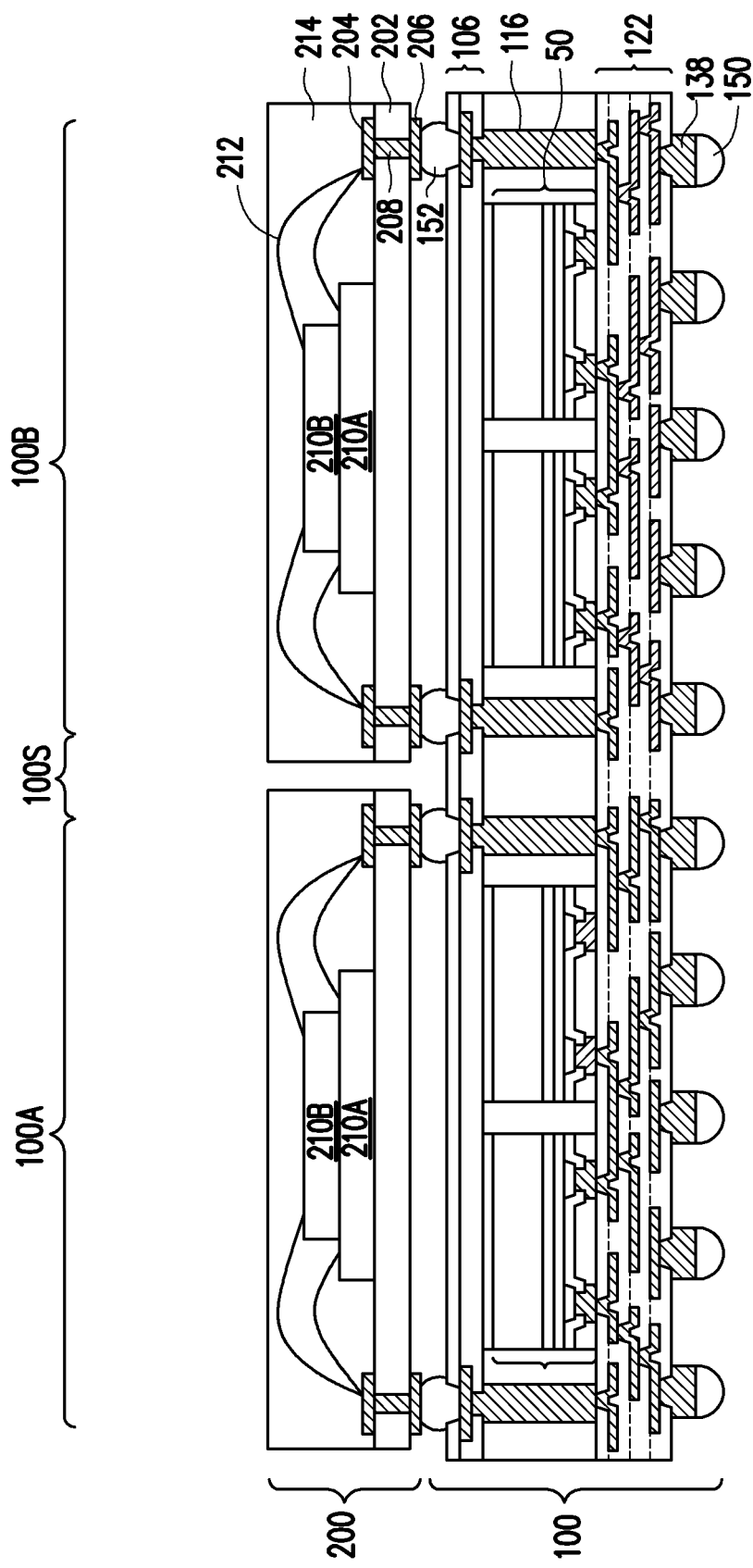

In FIG. 15, second package components 200 are coupled to the first package component 100. One of the second package components 200 are coupled in each of the package regions 100A and 100B to form an integrated circuit device stack in each region of the first package component 100.

The second package components 200 include a substrate 202 and one or more dies coupled to the substrate 202. In the illustrated embodiment, the dies include stacked dies 210A and 210B. In some embodiments, the dies (or die stacks) may be disposed side-by-side coupled to a same surface of the substrate 202. The substrate 202 may be made of a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 202 may be a silicon-on-insulator (SOI) substrate. Generally, an SOI substrate includes a layer of a semiconductor material such as epitaxial silicon, germanium, silicon germanium, SOI, silicon germanium on insulator (SGOI), or combinations thereof. The substrate 202 is, in one alternative embodiment, based on an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for substrate 202.

The substrate 202 may include active and passive devices (not shown). A wide variety of devices such as transistors, capacitors, resistors, combinations of these, and the like may be used to generate the structural and functional requirements of the design for the second package components 200. The devices may be formed using any suitable methods.

The substrate 202 may also include metallization layers (not shown) and conductive vias 208. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the substrate 202 is substantially free of active and passive devices.

The substrate 202 may have bond pads 204 on a first side of the substrate 202 to couple to the stacked dies 210A and 210B, and bond pads 206 on a second side of the substrate 202, the second side being opposite the first side of the substrate 202, to couple to the conductive connectors 152. In some embodiments, the bond pads 204 and 206 are formed by forming recesses into dielectric layers (not shown) on the first and second sides of the substrate 202. The recesses may be formed to allow the bond pads 204 and 206 to be embedded into the dielectric layers. In other embodiments, the recesses are omitted as the bond pads 204 and 206 may be formed on the dielectric layer. In some embodiments, the bond pads 204 and 206 include a thin seed layer made of copper, titanium, nickel, gold, palladium, the like, or a combination thereof. The conductive material of the bond pads 204 and 206 may be deposited over the thin seed layer. The conductive material may be formed by an electro-chemical plating process, an electroless plating process, CVD, atomic layer deposition (ALD), PVD, the like, or a combination thereof. In an embodiment, the conductive material of the bond pads 204 and 206 is copper, tungsten, aluminum, silver, gold, the like, or a combination thereof.

In an embodiment, the bond pads 204 and bond pads 206 are UBMs that include three layers of conductive materials, such as a layer of titanium, a layer of copper, and a layer of nickel. Other arrangements of materials and layers, such as an arrangement of chrome/chrome-copper alloy/copper/gold, an arrangement of titanium/titanium tungsten/copper, or an arrangement of copper/nickel/gold, may be utilized for the formation of the bond pads 204 and 206. Any suitable materials or layers of material that may be used for the bond pads 204 and 206 are fully intended to be included within the scope of the current application. In some embodiments, the conductive vias 208 extend through the substrate 202 and couple at least one of the bond pads 204 to at least one of the bond pads 206.

In the illustrated embodiment, the stacked dies 210A and 210B are coupled to the substrate 202 by wire bonds 212, although other connections may be used, such as conductive bumps. In an embodiment, the stacked dies 210A and 210B are stacked memory dies. For example, the stacked dies 210A and 210B may be memory dies such as low-power (LP) double data rate (DDR) memory modules, such as LPDDR1, LPDDR2, LPDDR3, LPDDR4, or the like memory modules.

The stacked dies 210A and 210B and the wire bonds 212 may be encapsulated by a molding material 214. The molding material 214 may be molded on the wire bonds 212 and the stacked dies 210A and 210B, for example, using compression molding. In some embodiments, the molding material 214 is a molding compound, a polymer, an epoxy, silicon oxide filler material, the like, or a combination thereof. A curing process may be performed to cure the molding material 214; the curing process may be a thermal curing, a UV curing, the like, or a combination thereof.

In some embodiments, the wire bonds 212 and the stacked dies 210A and 210B are buried in the molding material 214, and after the curing of the molding material 214, a planarization step, such as a grinding, is performed to remove excess portions of the molding material 214 and provide a substantially planar surface for the second package components 200.

After the second package components 200 are formed, the second package components 200 are mechanically and electrically bonded to the first package component 100 by way of the conductive connectors 152, the bond pads 206, and the back-side redistribution structure 106. In some embodiments, the stacked dies 210A and 210B may be coupled to the integrated circuit dies 50 through the wire bonds 212, the bond pads 204 and 206, conductive vias 208, the conductive connectors 152, the back-side redistribution structure 106, the through vias 116, and the front-side redistribution structure 122.

In some embodiments, a solder resist is formed on the side of the substrate 202 opposing the stacked dies 210A and 210B. The conductive connectors 152 may be disposed in openings in the solder resist to be electrically and mechanically coupled to conductive features (e.g., the bond pads 206) in the substrate 202. The solder resist may be used to protect areas of the substrate 202 from external damage.

In some embodiments, the conductive connectors 152 have an epoxy flux formed thereon before they are reflowed with at least some of the epoxy portion of the epoxy flux remaining after the second package components 200 are attached to the first package component 100.

In some embodiments, an underfill is formed between the first package component 100 and the second package components 200, surrounding the conductive connectors 152. The underfill may reduce stress and protect the joints resulting from the reflowing of the conductive connectors 152. The underfill may be formed by a capillary flow process after the second package components 200 are attached, or may be formed by a suitable deposition method before the second package components 200 are attached. In embodiments where the epoxy flux is formed, it may act as the underfill.

Figure 16:
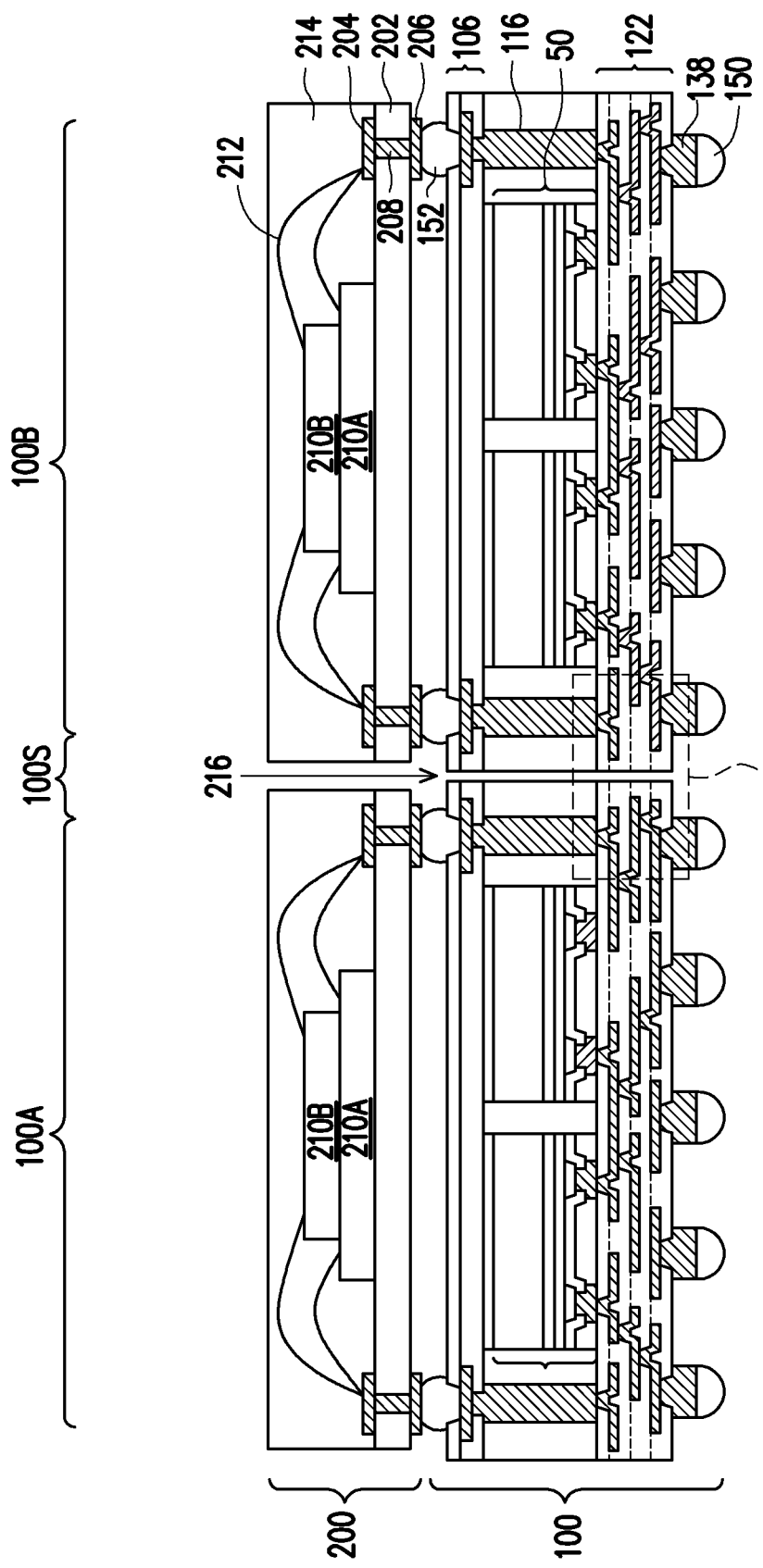

In FIG. 16, a singulation process is performed along scribe line regions, e.g., between the first package region 100A and the second package region 100B. The singulation process may be a sawing process, a cutting process, a laser cutting process, or the like. The singulation process singulates the first package region 100A from the second package region 100B, forming openings 216 between the package regions of the first package component 100. In some embodiments, the singulation process is performed after the second package components 200 are coupled to the first package component 100. In other embodiments, the singulation process is performed before the second package components 200 are coupled to the first package component 100, such as after the carrier substrate 102 is de-bonded and the conductive connectors 152 are formed. Each resulting, singulated package is from one of the first package region 100A or the second package region 100B.

Figure 17:
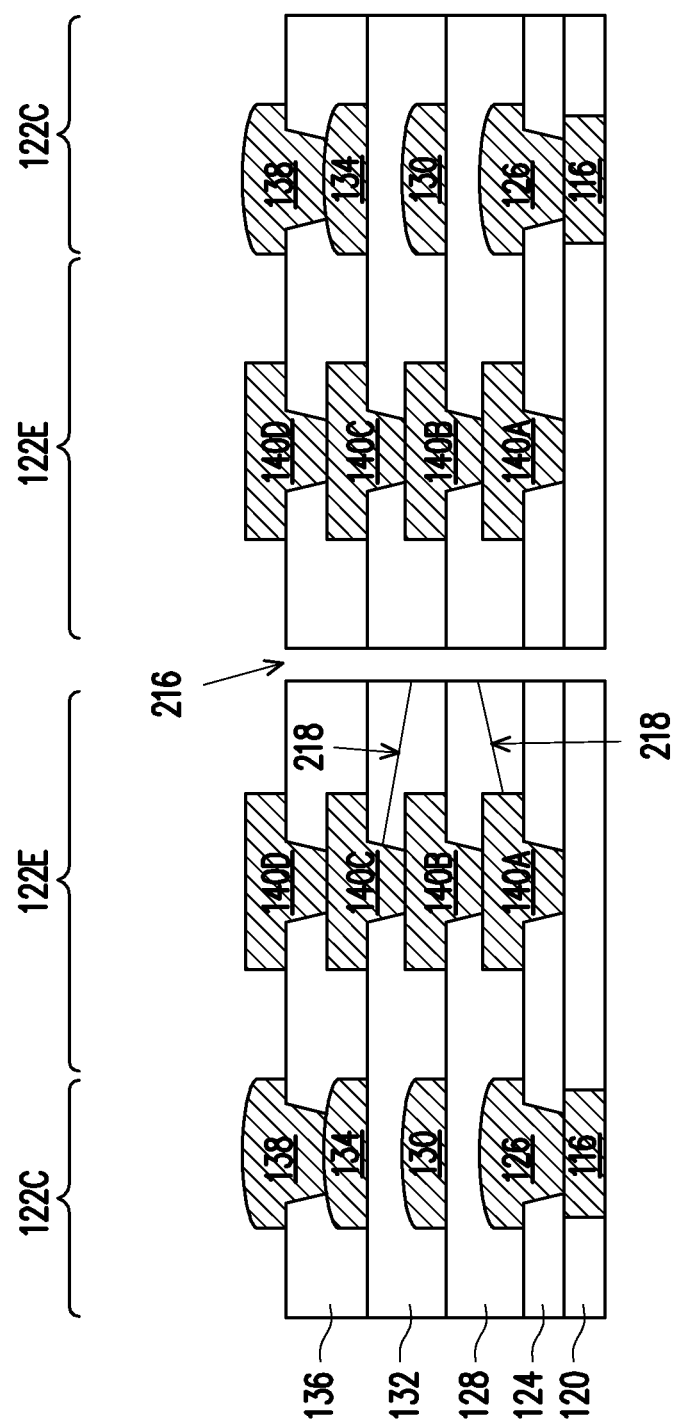

FIG. 17 illustrates further details of the front-side redistribution structure 122 after the singulation process. A region 17 in FIG. 16 is shown in more detail. FIG. 18 illustrates the front-side redistribution structure 122 in a top-down view, and is described concurrently with FIG. 17. After singulation is complete, the sealing rings 140 each surround a singulated central region 122C of the front-side redistribution structure 122. Each singulated package includes one sealing ring 140, with each sealing ring 140 being disposed along the edges of the singulated encapsulant 120. During singulation, cracks 218 may form in the dielectric layers of the front-side redistribution structure 122. The sealing rings 140 prevent the cracks 218 from spreading, and the cracks 218 are thus confined to the singulated edge regions 122E of the front-side redistribution structure 122. The singulated central regions 122C of the front-side redistribution structure 122 may thus be free from cracks. For example, the cracks 218 extend continuously from an exterior edge of the singulated front-side redistribution structure 122 to the sealing rings 140, and further terminate at the sidewalls of the sealing rings 140.

Figure 19:
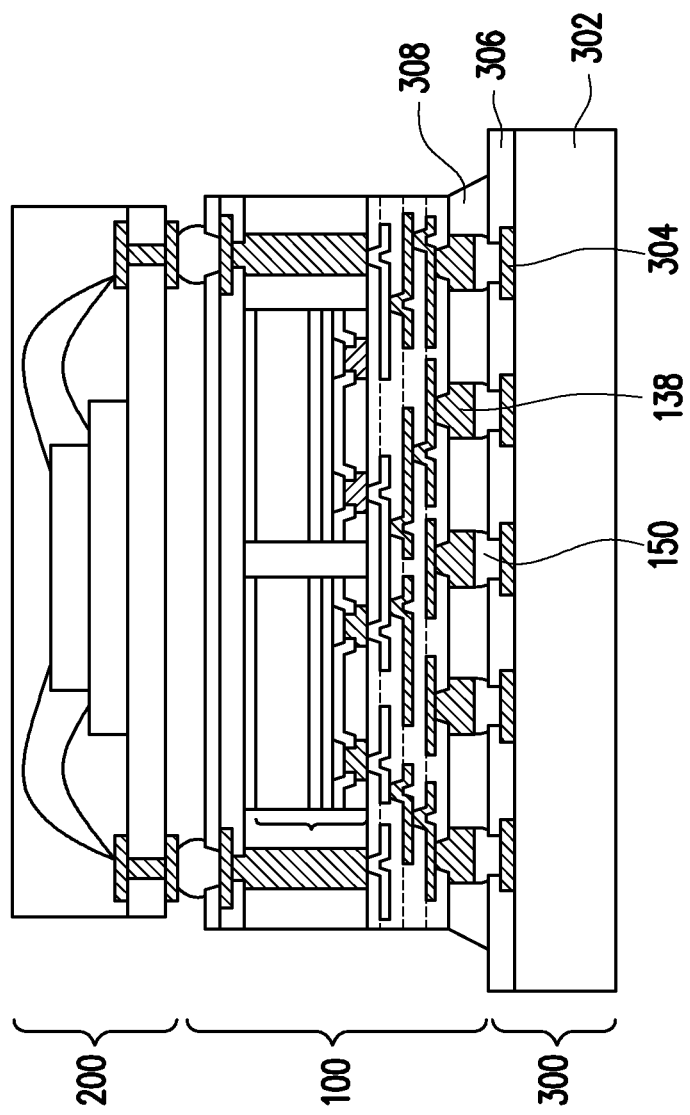

In FIG. 19, each singulated first package component 100 is then mounted to a package substrate 300 using the conductive connectors 150. The package substrate 300 includes a substrate core 302 and bond pads 304 over the substrate core 302. The substrate core 302 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate core 302 may be a SOI substrate. Generally, an SOI substrate includes a layer of a semiconductor material such as epitaxial silicon, germanium, silicon germanium, SOI, SGOI, or combinations thereof. The substrate core 302 is, in one alternative embodiment, based on an insulating core such as a fiberglass reinforced resin core. One example core material is fiberglass resin such as FR4. Alternatives for the core material include bismaleimide-triazine BT resin, or alternatively, other PCB materials or films. Build up films such as ABF or other laminates may be used for substrate core 302.

The substrate core 302 may include active and passive devices (not shown). As one of ordinary skill in the art will recognize, a wide variety of devices such as transistors, capacitors, resistors, combinations of these, and the like may be used to generate the structural and functional requirements of the design for the device stack. The devices may be formed using any suitable methods.

The substrate core 302 may also include metallization layers and vias (not shown), with the bond pads 304 being physically and/or electrically coupled to the metallization layers and vias. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the substrate core 302 is substantially free of active and passive devices.

In some embodiments, the conductive connectors 150 are reflowed to attach the first package component 100 to the bond pads 304. The conductive connectors 150 electrically and/or physically couple the package substrate 300, including metallization layers in the substrate core 302, to the first package component 100. In some embodiments, a solder resist 306 is formed on the substrate core 302. The conductive connectors 150 may be disposed in openings in the solder resist 306 to be electrically and mechanically coupled to the bond pads 304. The solder resist 306 may be used to protect areas of the substrate 202 from external damage.

The conductive connectors 150 may have an epoxy flux formed thereon before they are reflowed with at least some of the epoxy portion of the epoxy flux remaining after the first package component 100 is attached to the package substrate 300. This remaining epoxy portion may act as an underfill to reduce stress and protect the joints resulting from the reflowing the conductive connectors 150. In some embodiments, an underfill 308 may be formed between the first package component 100 and the package substrate 300 and surrounding the conductive connectors 150. The underfill 308 may be formed by a capillary flow process after the first package component 100 is attached or may be formed by a suitable deposition method before the first package component 100 is attached.

In some embodiments, passive devices (e.g., surface mount devices (SMDs), not illustrated) may also be attached to the first package component 100 (e.g., to the UBMs 138) or to the package substrate 300 (e.g., to the bond pads 304). For example, the passive devices may be bonded to a same surface of the first package component 100 or the package substrate 300 as the conductive connectors 150. The passive devices may be attached to the first package component 100 prior to mounting the first package component 100 on the package substrate 300, or may be attached to the package substrate 300 prior to or after mounting the first package component 100 on the package substrate 300.

Figure 20:
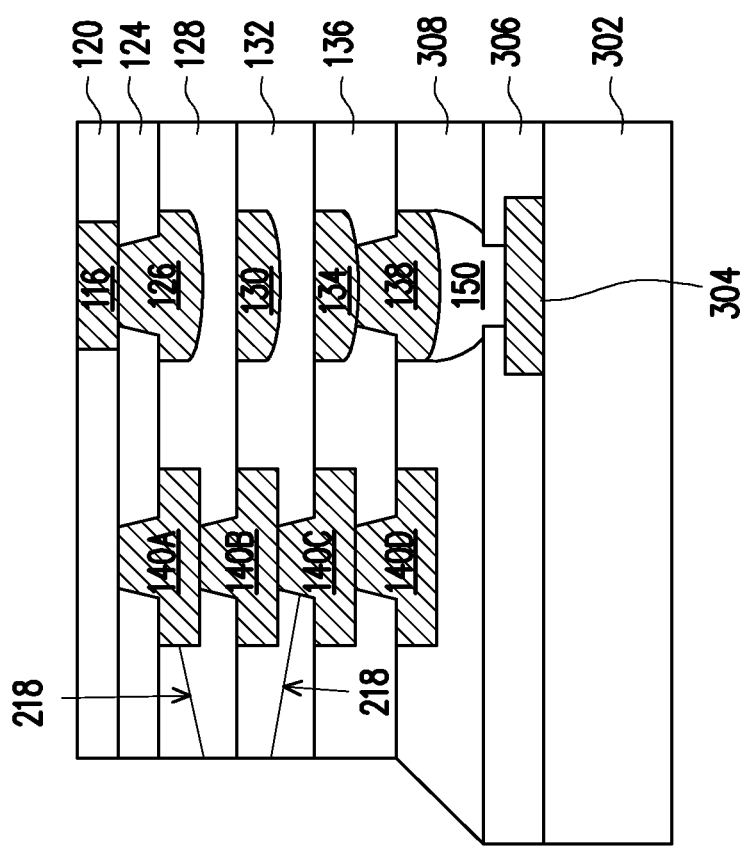

FIG. 20 illustrates further details of the resulting device stack after formation of the underfill 308. A region 20 in FIG. 19 is shown in more detail. After the underfill 308 is formed, it surrounds the conductive connectors 150 and exposed portions of the sealing rings 140. For example, the underfill 308 may contact sidewalls of the fourth layers 140D of the sealing rings 140, when formed.

It should be appreciated that the first package component 100 may be implement in other device stacks. For example, a PoP structure is shown, but the first package component 100 may also be implemented in a Flip Chip Ball Grid Array (FCBGA) package. In such embodiments, the first package component 100 is mounted to a substrate such as the package substrate 300, but the second package component 200 is omitted. Instead, a lid or heat spreader may be attached to the first package component 100. When the second package component 200 is omitted, the back-side redistribution structure 106 and through vias 116 may also be omitted.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 21:
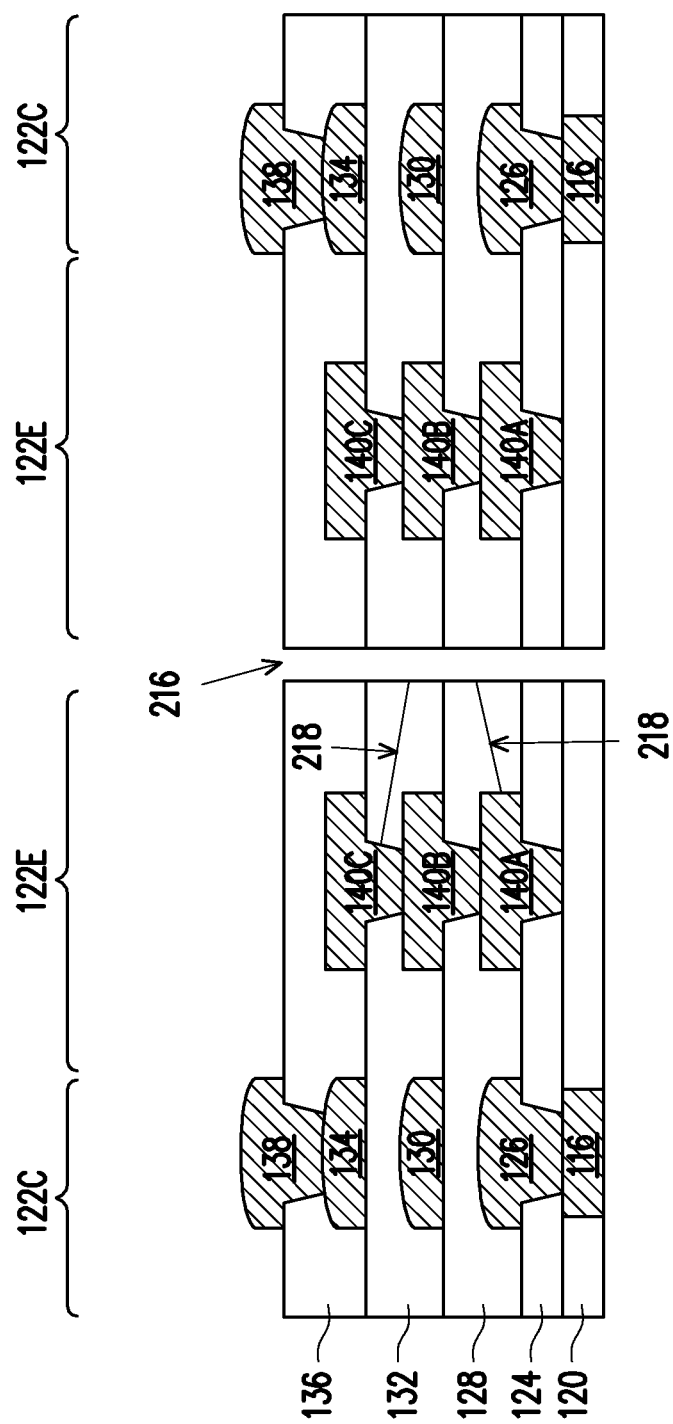
FIGS. 21 through 23 illustrate various views of intermediate steps during a process for forming package components, in accordance with some other embodiments.

FIG. 21 illustrates details of the front-side redistribution structure 122, in accordance with some other embodiments. The region 17 in FIG. 16 is shown in more detail. In this embodiments, the fourth layers 140D of the sealing rings 140 are omitted. As such, the sealing ring 140 is buried beneath the dielectric layer 136.

Figure 22:
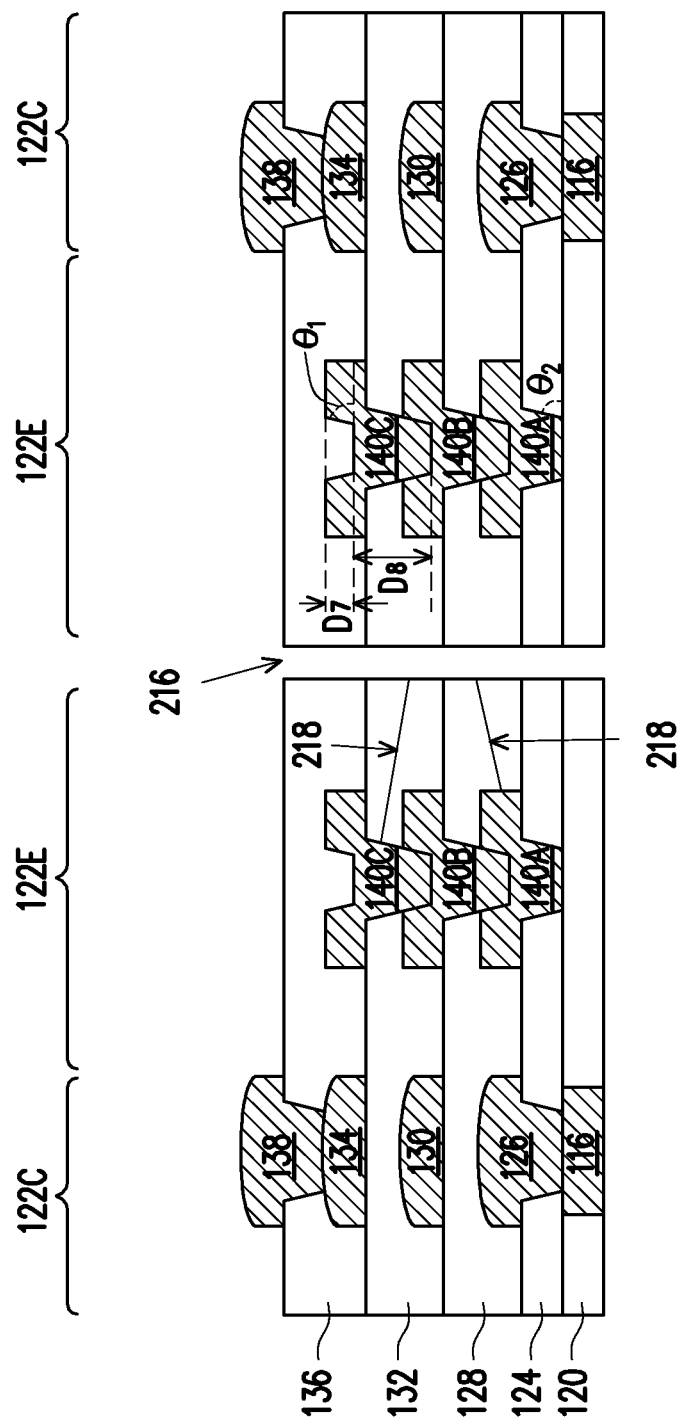

FIG. 22 illustrates details of the front-side redistribution structure 122, in accordance with some other embodiments. The region 17 in FIG. 16 is shown in more detail. In this embodiment, the layers 140A, 140B, and 140C of the sealing rings 140 have concave topmost surfaces. As such, the interfaces of the sealing ring layers 140A, 140B, and 140C are non-planar. The sealing rings 140 may be formed with concave topmost surfaces by varying the parameters of the plating process for forming the sealing ring layers 140A, 140B, and 140C. In particular, a low plating current density, a high plating temperature, and a high agitation speed may be used for the plating process. For example, the current density can be in the range of about 0.5 A/dm$^2$ to about 1.5 A/dm$^2$, the temperature can be in the range of about 25° C. to about 35° C., and the agitation speed can be in the range of about 50 RPM to about 375 RPM. The concave topmost surfaces of the sealing ring layers 140A, 140B, and 140C have a depth D$_7$, which is greater than the remaining depth D$_8$ of the sealing ring layers 140A, 140B, and 140C. The depth D$_7$ can be in the range of about 5 µm to about 10 µm, and the depth D$_8$ can be in the range of about 0 µm to about 5 µm. Further, the concave topmost surfaces of the sealing ring layers 140A, 140B, and 140C have interior angles θ$_1$, which are less than the angles θ$_2$ formed by the sidewalls of the via portions of the sealing ring layers 140A, 140B, and 140C. The angle θ$_1$ can be in the range of about 0° to about 70°, and the angle θ$_2$ can be in the range of about 70° to about 90°.

Figure 23:
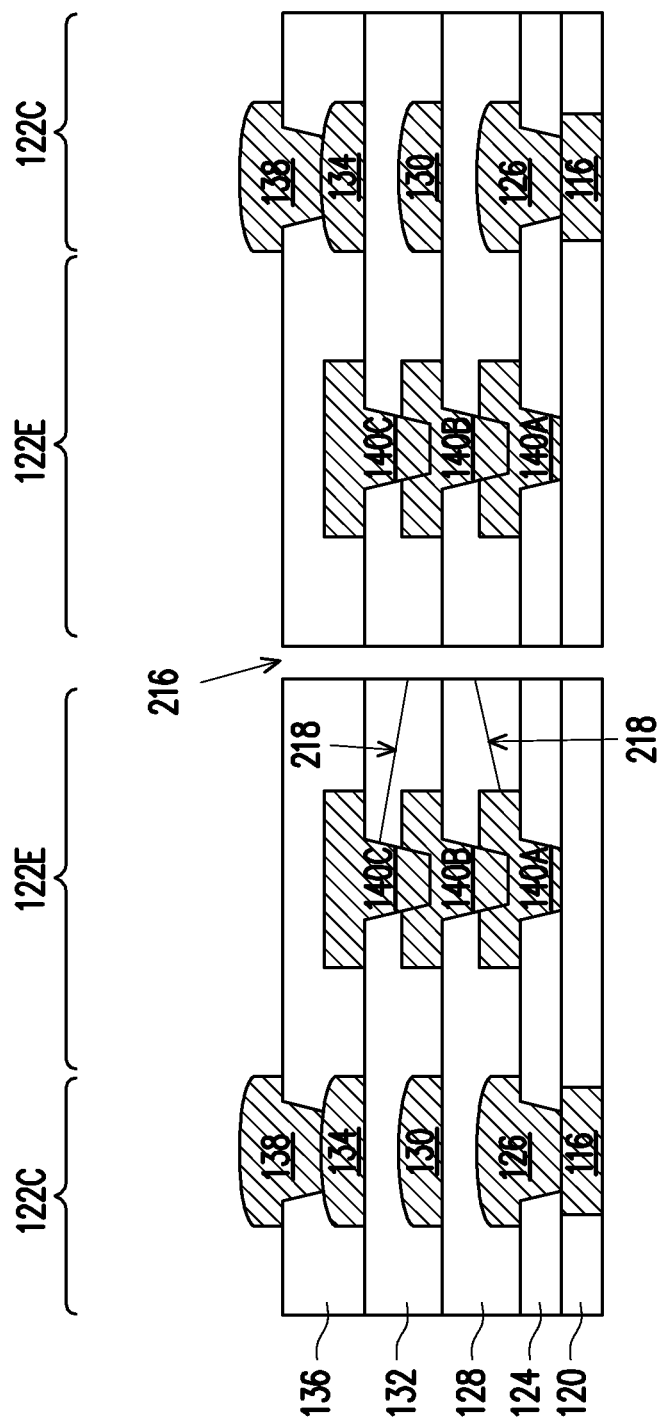

FIG. 23 illustrates details of the front-side redistribution structure 122, in accordance with some other embodiments. The region 17 in FIG. 16 is shown in more detail. In this embodiment, a subset of the layers of the sealing rings 140 have concave topmost surfaces, and another subset of the layers of the sealing rings 140 have flat topmost surfaces. In particular, the topmost layers of the sealing rings 140 have flat topmost surfaces, and underlying layers have concave topmost surfaces. As such, the interfaces of the layers of the sealing rings 140 are non-planar. The sealing rings 140 may be formed with a mix of flat and concave topmost surfaces by varying the parameters of the plating process for forming the layers of the sealing rings 140. For example, the layers 140A and 140B of the sealing rings 140 can be formed with a high plating current density, a low plating temperature, and a low agitation speed, as discussed above with respect to FIGS. 9A through 9E. For example, the high current density can be in the range of about 1 A/dm$^2$ to about 7 A/dm$^2$, the low temperature can be in the range of about 22° C. to about 25° C., and the low agitation speed can be in the range of about 0 RPM to about 50 RPM. Likewise, the layer 140C of the sealing rings 140 can be formed with a low plating current density, a high plating temperature, and a high agitation speed, as discussed above with respect to FIG. 22. For example, the low current density can be in the range of about 0.5 A/dm$^2$ to about 1.5 A/dm$^2$, the high temperature can be in the range of about 25° C. to about 35° C., and the high agitation speed can be in the range of about 50 RPM to about 375 RPM.

Embodiments may achieve advantages. By forming the sealing rings 140, singulation-induced delamination and peeling in the front-side redistribution structure 122 may be reduced. Forming the sealing rings 140 with multiple layers stacked along a common axis allows the footprint of the sealing rings 140 to be reduced, thus decreasing the overall size of the package regions 100A and 100B. In one experiment, the overall size of the package regions was reduced by about 8.6%, and the amount of packages formed on the single carrier substrate 102 was increased by about 2.4%.

In an embodiment, a device includes: an integrated circuit die; an encapsulant at least partially surrounding the integrated circuit die; and a redistribution structure including: a plurality of dielectric layers over the encapsulant and the integrated circuit die; a plurality of metallization patterns in the dielectric layers, the metallization patterns being electrically coupled to the integrated circuit die; and a sealing ring in the dielectric layers, the sealing ring extending around the metallization patterns, the sealing ring being electrically isolated from the metallization patterns and the integrated circuit die, the sealing ring including a plurality of sealing ring layers, each of the sealing ring layers including a via portion extending through a respective one of the dielectric layers, the via portion of each of the sealing ring layers being aligned along a same common axis.

In some embodiments, the device further includes: a through via extending through the encapsulant, the through via being electrically coupled to the metallization patterns, the through via being electrically isolated from the sealing ring. In some embodiments of the device, the sealing ring layers each further include: a line portion extending along the respective one of the dielectric layers. In some embodiments of the device, the line portion of each of the sealing ring layers has a planar topmost surface. In some embodiments of the device, the line portion of each of the sealing ring layers has a non-planar topmost surface. In some embodiments of the device, the line portion of a first subset of the sealing ring layers has a planar topmost surface, and the line portion of a second subset of the sealing ring layers has a non-planar topmost surface. In some embodiments of the device, the via portion of each of the sealing ring layers has a same first width. In some embodiments of the device, the line portion of each of the sealing ring layers has a first height, the via portion of each of the sealing ring layers has a second height, and the second height is greater than the first height. In some embodiments of the device, a topmost surface of the sealing ring extends above a topmost surface of a topmost layer of the dielectric layers. In some embodiments of the device, a topmost surface of a topmost layer of the dielectric layers extends above a topmost surface of the sealing ring. In some embodiments of the device, the sealing ring is separated from features of the metallization patterns by a first distance, the first distance being in a range of 20 µm to 30 µm. In some embodiments of the device, the sealing ring is separated from edges of the encapsulant by a second distance, the second distance being in a range of 10 µm to 20 µm.

In an embodiment, a method includes: placing an integrated circuit die adjacent a through via; encapsulating the through via and the integrated circuit die with an encapsulant; depositing a first dielectric layer over the encapsulant; patterning a first opening and a plurality of second openings in the first dielectric layer, the first opening exposing the encapsulant, the second openings exposing the through via and the integrated circuit die, the first opening extending continuously around the second openings; forming a first sealing ring layer in the first opening and a first metallization pattern in the second openings; depositing a second dielectric layer over the first sealing ring layer and the first metallization pattern; patterning a third opening and a plurality of fourth openings in the second dielectric layer, the third opening exposing the first sealing ring layer, the fourth openings exposing the first metallization pattern, the third opening extending continuously around the fourth openings, the third opening being disposed directly over the first opening; and forming a second sealing ring layer in the third opening and a second metallization pattern in the fourth openings.

In some embodiments of the method, forming the first sealing ring layer and the first metallization pattern includes: plating the first sealing ring layer and the first metallization pattern simultaneously with a same plating process, where after the plating process, the first sealing ring layer has a flat or concave topmost surface, and the first metallization pattern has a convex topmost surface. In some embodiments of the method, the plating process is performed at a current density of from 1 A/dm$^2$ to 7 A/dm$^2$. In some embodiments of the method, the plating process is performed at an agitation speed of less than 50 rpm. In some embodiments of the method, the plating process is performed at a temperature of from 22° C. to 25° C. In some embodiments of the method, the plating process is performed with a plating solution that includes an accelerator and a suppressor.

In an embodiment, a method includes: encapsulating an integrated circuit die with an encapsulant; depositing a first dielectric layer over the encapsulant; forming a first metallization pattern having a first via portion extending through the first dielectric layer and a first line portion extending along the first dielectric layer; forming a first sealing ring layer having a second via portion extending through the first dielectric layer and a second line portion extending along the first dielectric layer, the second via portion having a lesser width than the first via portion; depositing a second dielectric layer over the first sealing ring layer and the first metallization pattern; forming a second metallization pattern having a third via portion extending through the second dielectric layer and a third line portion extending along the second dielectric layer; and forming a second sealing ring layer having a fourth via portion extending through the second dielectric layer and a fourth line portion extending along the second dielectric layer, the fourth via portion having a lesser width than the third via portion, the fourth via portion and the second via portion being overlapping conductive rings in a plan view.

In some embodiments of the method, the first metallization pattern and the first sealing ring layer are simultaneously formed in a first plating process, and the second metallization pattern and the second sealing ring layer are simultaneously formed in a second plating process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method comprising:
encapsulating an integrated circuit die with an encapsulant;
depositing a first dielectric layer over the encapsulant;
patterning a first opening and a plurality of second openings in the first dielectric layer, the first opening exposing the encapsulant, the second openings exposing the integrated circuit die, the first opening extending continuously around the second openings;
forming a first sealing ring layer in the first opening and a first metallization pattern in the second openings;
depositing a second dielectric layer over the first sealing ring layer and the first metallization pattern;
patterning a third opening and a plurality of fourth openings in the second dielectric layer, the third opening exposing the first sealing ring layer, the fourth openings exposing the first metallization pattern, the third opening extending continuously around the fourth openings, the third opening being disposed directly over the first opening; and forming a second sealing ring layer in the third opening and a second metallization pattern in the fourth openings, the first sealing ring layer and the second sealing ring layer having respective concave top surfaces, the first metallization pattern and the second metallization pattern having respective convex top surfaces.

2. The method of claim 1, wherein forming the first sealing ring layer and the first metallization pattern comprises:
plating the first sealing ring layer and the first metallization pattern simultaneously with a same plating process.

3. The method of claim 2, wherein the plating process is performed at a current density of from 0.5 A/dm$^2$ to 1.5 A/dm$^2$.

4. The method of claim 2, wherein the plating process is performed at an agitation speed of from 50 RPM to 375 RPM.

5. The method of claim 2, wherein the plating process is performed at a temperature of from 25° C. to 35° C.

6. The method of claim 2, wherein the plating process is performed with a plating solution that includes an accelerator and a suppressor at a concentration ratio of 1:2.

7. The method of claim 1 further comprising:
placing the integrated circuit die adjacent a through via, the through via being encapsulated by the encapsulant, one of the second openings exposing the through via.

8. The method of claim 1 further comprising:
depositing a third dielectric layer over the second sealing ring layer and the second metallization pattern;
patterning a fifth opening and a plurality of sixth openings in the third dielectric layer, the fifth opening exposing the second sealing ring layer, the sixth openings exposing the second metallization pattern, the fifth opening extending continuously around the sixth openings, the fifth opening being disposed directly over the third opening; and
forming a third sealing ring layer in the fifth opening and a third metallization pattern in the sixth openings, the third sealing ring layer having a flat top surface, the third metallization pattern having respective convex top surfaces.

9. The method of claim 8, wherein forming the first sealing ring layer and the first metallization pattern comprises plating the first sealing ring layer and the first metallization pattern simultaneously with a first plating process, wherein forming the second sealing ring layer and the second metallization pattern comprises plating the second sealing ring layer and the second metallization pattern simultaneously with a second plating process, wherein forming the third sealing ring layer and the third metallization pattern comprises plating the third sealing ring layer and the third metallization pattern simultaneously with a third plating process, and wherein the third plating process has a higher plating current density, a lower plating temperature, and a lower agitation speed than the first plating process and the second plating process.

10. A method comprising:
encapsulating an integrated circuit die with an encapsulant;
depositing a first dielectric layer over the encapsulant;
forming a first metallization pattern having a first via portion extending through the first dielectric layer and a first line portion extending along the first dielectric layer, the first metallization pattern having first convex topmost surfaces;

forming a first sealing ring layer having a second via portion extending through the first dielectric layer and a second line portion extending along the first dielectric layer, the second via portion having a lesser width than the first via portion, the first sealing ring layer having a first concave topmost surface;

depositing a second dielectric layer over the first sealing ring layer and the first metallization pattern;

forming a second metallization pattern having a third via portion extending through the second dielectric layer and a third line portion extending along the second dielectric layer, the second metallization pattern having second convex topmost surfaces; and forming a second sealing ring layer having a fourth via portion extending through the second dielectric layer and a fourth line portion extending along the second dielectric layer, the fourth via portion having a lesser width than the third via portion, the second sealing ring layer having a second concave topmost surface, the fourth via portion and the second via portion being overlapping conductive rings in a plan view.

11. The method of claim 10, wherein the first metallization pattern and the first sealing ring layer are simultaneously formed in a first plating process, and the second metallization pattern and the second sealing ring layer are simultaneously formed in a second plating process.

12. The method of claim 10 further comprising:
forming an underfill on the second sealing ring layer, the underfill contacting a top surface and sidewalls of the second sealing ring layer.

13. The method of claim 10, wherein the first sealing ring layer and the second sealing ring layer collectively surround first regions of the first dielectric layer and the second dielectric layer, the method further comprising:
sawing second regions of the first dielectric layer and the second dielectric layer, the first sealing ring layer and the second sealing ring layer collectively separating the first regions from the second regions, the sawing forming cracks in the second regions, the first regions remaining free from cracks after the sawing.

14. The method of claim 10 further comprising:
depositing a third dielectric layer over the second sealing ring layer and the second metallization pattern;

forming a third metallization pattern having a fifth via portion extending through the third dielectric layer and a fifth line portion extending along the third dielectric layer, the third metallization pattern having third convex topmost surfaces; and forming a third sealing ring layer having a sixth via portion extending through the third dielectric layer and a sixth line portion extending along the third dielectric layer, the sixth via portion having a lesser width than the fifth via portion, the third sealing ring layer having a flat topmost surface, the sixth via portion and the fourth via portion being overlapping conductive rings in a plan view.

15. A method comprising:
encapsulating an integrated circuit die with an encapsulant;

forming a redistribution structure on the integrated circuit die and the encapsulant, the redistribution structure comprising dielectric layers, metallization patterns among the dielectric layers, and a sealing ring extending through the dielectric layers, the metallization patterns having respective convex top surfaces, the sealing ring surrounding the metallization patterns, the sealing ring comprising a plurality of sealing ring layers, a first subset of the sealing ring layers having respective concave top surfaces, a second subset of the sealing ring layers having respective flat top surfaces, each of the sealing ring layers having a center aligned along a same common axis; and sawing the redistribution structure and the encapsulant, the sawing forming cracks in the dielectric layers, the cracks extending continuously from sidewalls of the dielectric layers to sidewalls of the sealing ring, the cracks terminating at the sidewalls of the sealing ring.

16. The method of claim 15 further comprising:
forming a through via extending through the encapsulant, the through via being electrically coupled to the metallization patterns, the through via being electrically isolated from the sealing ring.

17. The method of claim 15, wherein the sealing ring is separated from the metallization patterns by a first distance, and the sealing ring is separated from the sidewalls of the dielectric layers by a second distance, the second distance being less than the first distance.

18. The method of claim 17, wherein the first distance and the second distance are each in a range of 20 µm to 30 µm.

19. The method of claim 17 further comprising:
after sawing the redistribution structure and the encapsulant, connecting the metallization patterns of the redistribution structure to a package substrate; and forming an underfill between the redistribution structure and the package substrate, the underfill contacting a surface of the package substrate and the sidewalls of the sealing ring.

20. The method of claim 15, wherein the second subset of the sealing ring layers is disposed over the first subset of the sealing ring layers.

* * * * *